United States Patent [19]

Collins

[11] Patent Number: 5,707,486

[45] Date of Patent: Jan. 13, 1998

[54] PLASMA REACTOR USING UHF/VHF AND RF TRIODE SOURCE, AND PROCESS

[75] Inventor: Kenneth S. Collins, San Jose, Calif.

[73] Assignee: Applied Materials, Inc., Santa Clara, Calif.

[21] Appl. No.: 683,125

[22] Filed: Jul. 16, 1996

Related U.S. Application Data

[63] Continuation of Ser. No. 367,912, Jan. 3, 1995, abandoned, which is a continuation of Ser. No. 128,033, Sep. 28, 1993, abandoned, which is a continuation of Ser. No. 644,004, Jan. 18, 1991, abandoned, which is a continuation-in-part of Ser. No. 626,050, Dec. 7, 1990, abandoned, which is a continuation-in-part of Ser. No. 624,740, Dec. 3, 1990, abandoned, which is a continuation-in-part of Ser. No. 559,947, Jul. 31, 1990, Pat. No. 5,210,466.

[51] Int. Cl.$^6$ .............................. B44C 1/22; C03C 15/00; H01L 21/306

[52] U.S. Cl. .................... 156/643.1; 156/345; 216/67; 216/70; 204/298.34

[58] Field of Search .................... 156/345, 643.1, 156/646.1; 216/67, 63, 71; 204/192.12, 192.32, 298.06, 298.34

[56] References Cited

U.S. PATENT DOCUMENTS

| | | | |
|---|---|---|---|
| 3,873,884 | 3/1975 | Gabriel | 315/267 |
| 4,123,316 | 10/1978 | Tsuchimoto | 156/643 |
| 4,368,092 | 1/1983 | Steinberg et al. | 156/345 |
| 4,382,100 | 5/1983 | Holland | 427/38 |
| 4,464,223 | 8/1984 | Gorin | 204/298.34 X |
| 4,572,759 | 2/1986 | Benzing | 156/345 |
| 4,579,618 | 4/1986 | Celestino et al. | 204/298.34 X |
| 4,585,516 | 4/1986 | Corn et al. | 204/298.34 X |
| 4,585,668 | 4/1986 | Asmussen et al. | 427/38 |
| 4,617,079 | 10/1986 | Tracy et al. | 204/192.32 X |
| 4,622,094 | 11/1986 | Otsubo | 156/627 |
| 4,755,345 | 7/1988 | Baity, Jr. et al. | 376/123 |
| 4,788,473 | 11/1988 | Mori et al. | 315/39 |
| 4,792,732 | 12/1988 | O'Loughlin | 315/334 |
| 4,810,935 | 3/1989 | Boswell | 315/111.41 |
| 4,824,546 | 4/1989 | Ohmi | 204/192.12 X |
| 4,828,369 | 5/1989 | Hotomi | 350/357 |

(List continued on next page.)

FOREIGN PATENT DOCUMENTS

| | | | |
|---|---|---|---|
| 309648 | of 0000 | European Pat. Off. | H01J 37/32 |
| 334648 | of 0000 | European Pat. Off. | C23C 16/50 |
| 0058820 | 9/1982 | European Pat. Off. | |
| 0334638 | 9/1989 | European Pat. Off. | |
| 61-64124 | of 0000 | Japan | H01L 21/205 |

OTHER PUBLICATIONS

Boyer, "Hula-Hoop Antennas": A Coming Trend?,Electronics, Jan. 11, 1963, pp. 44–46.

Coburn et al, "Positive-Ion Bombardment of Substrates in RF Diode Glow Discharge Sputtering", J. Appl. Phys., vol. 43, 1972, p. 4965.

(List continued on next page.)

*Primary Examiner*—Nam Nguyen
*Attorney, Agent, or Firm*—Peter J. Sgarbossa; Birgit E. Morris

[57] ABSTRACT

A plasma reactor preferably uses a split electrode which surrounds a plasma dome region of the reactor, is driven by high frequency energy selected from VHF and UHF and produces an electric field inside the electrode, parallel to the wafer support electrode. A static axial magnetic field may be used which is perpendicular to the electric field. The above apparatus generates a high density, low energy plasma inside a vacuum chamber for etching metals, dielectrics and semiconductor materials. Relatively lower frequency, preferably RF frequency, auxiliary bias energy applied to the wafer support cathode controls the cathode sheath voltage and controls the ion energy independent of density. Various etch processes, deposition processes and combined etch/deposition processes (for example, sputter/facet deposition) are disclosed. The triode (VHF/UHF split electrode plus RF wafer support electrode) provides processing of sensitive devices without damage and without microloading, thus providing increased yields.

19 Claims, 5 Drawing Sheets

U.S. PATENT DOCUMENTS

| | | | |
|---|---|---|---|
| 4,829,215 | 5/1989 | Kim et al. | 315/111.41 |
| 4,842,683 | 6/1989 | Cheng et al. | 156/345 |
| 4,849,675 | 7/1989 | Müller | 315/111.51 |
| 4,859,908 | 8/1989 | Yoshida et al. | 315/111.81 |
| 4,863,549 | 9/1989 | Grunwald | 204/298.34 X |
| 4,877,999 | 10/1989 | Knapp et al. | 315/248 |
| 4,889,588 | 12/1989 | Fior | 204/298.34 X |
| 4,906,898 | 3/1990 | Moisan | 315/39 |
| 4,908,492 | 3/1990 | Okamoto et al. | 219/121.52 |
| 4,918,031 | 4/1990 | Flamm et al. | 437/225 |
| 4,948,458 | 8/1990 | Ogle | 156/643 |
| 4,950,377 | 8/1990 | Huebner | 204/298.34 X |
| 4,950,956 | 8/1990 | Asamaki et al. | 315/111.21 |
| 4,990,229 | 2/1991 | Campbell et al. | 204/298.06 |
| 5,022,979 | 6/1991 | Hijikata et al. | 204/298.31 X |
| 5,028,847 | 7/1991 | Greb et al. | 315/248 |
| 5,064,522 | 11/1991 | Wellerdieck | 204/298.34 X |
| 5,110,438 | 5/1992 | Ohmi et al. | 204/298.34 X |

OTHER PUBLICATIONS

Keller et al, "A Dual Frequency, Tri–Electrode System For Etching Polysilicon", Mat. Res. Soc. Symp. Proc., vol. 38, 1985, pp. 243–246.

Martin et al, "RF Bias to Control Stress and Hydrogen in PECVD Nitride", Proceedings of the IEEE VLSI Multilevel Interconnection Conference, Jun. 13–14, 1988, pp. 286–292.

Cook et al, "Application of a Low–Pressure Radio Frequency Discharge Source to Polysylicon Gate Etching", J. Vac. Sci. Technol. B, vol. 8, No. 1, Feb. 1990, pp. 1–4.

Yoshida et al, "Fabrication of a–Si:H TFT's by a Large Area Ion Doping Technique", Extended Abstracts of the 22nd Conference on Solid State Devices and Materials, Aug. 22–24, 1990, pp. 1197–1198.

Nutley, "Single Wafer, Anisotropic Etching of Polysilicon with Cl2/SF6 and Trielectrode Reactor Operation" (date and publication unknown).

Goto et al, "Development of Dual Excitation Plasma Equipment (DEPE) to Minimize Wafer Surface Damage and Chamber Material Contamination" (date and publication unknown).

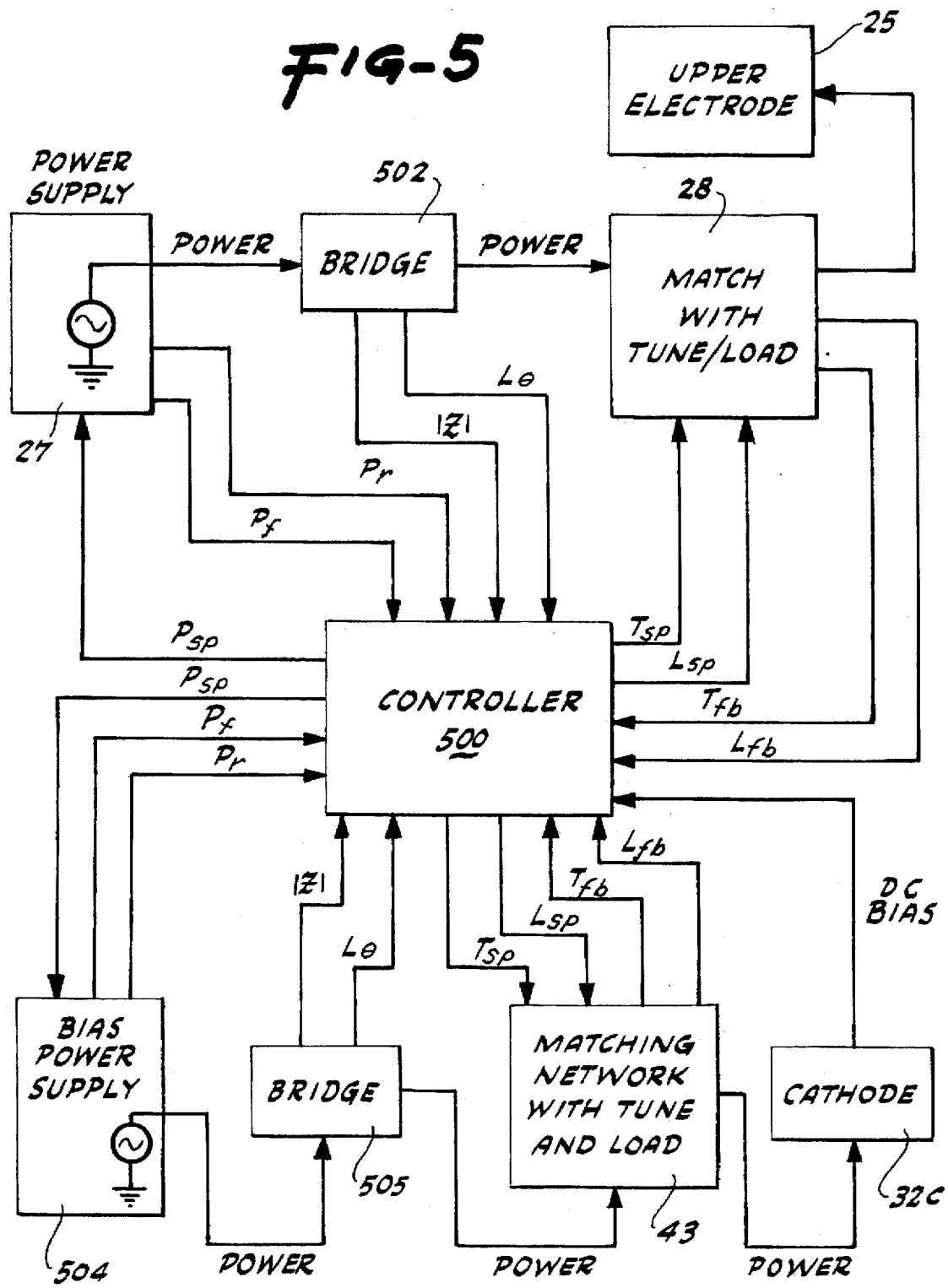

PLASMA REACTOR USING UHF/VHF AND RF TRIODE SOURCE, AND PROCESS

CROSS REFERENCE TO RELATED APPLICATIONS

This is a continuation of U.S. application Ser. No. 08/367,912 filed Jan. 3, 1995, abandoned which is a continuation of U.S. application Ser. No. 08/128,033 filed Sep. 28, 1993 abandoned, which is a continuation of U.S. application Ser. No. 07/644,004, now abandoned, which application is a continuation-in-part of, commonly assigned U.S. patent application, Ser. No. 626,050, entitled PLASMA REACTOR USING UHF/VHF RESONANT ANTENNA SOURCE, AND PROCESSES, filed Dec. 7, 1990, in the name of inventor Collins (AMAT file no. 252-1), now abandoned as a continuation-in-part of commonly assigned U.S. patent application, Ser. No. 624,740, entitled PLASMA REACTOR USING UHF/VHF RESONANT ANTENNA SOURCE, AND METHOD PROCESSES, FILED Dec. 3, 1990, in the name of the inventor Collins (AMAT file no. 252), as a continuation-in-part of, now abandoned, commonly assigned U.S. patent application, Ser. No. 559,947, entitled UHF/VHF REACTOR SYSTEM, filed Jul. 31, 1990, in the name of inventors Collins et al (AMAT file No. 151-1), now issued as U.S. Pat. No. 5,210,466.

BACKGROUND OF THE INVENTION

1. Field of the Invention

The present invention relates to RF plasma processing reactors and, more particularly, to an inventive plasma reactor which uses high frequency (HF) and low frequency (LF) energy sources and associated electrodes for coupling the HF and LF energy to the plasma.

2. Description of the Related Technology

The trend toward increasingly dense integrated geometries has resulted in components and devices of very small geometry which are electrically sensitive and susceptible to damage when subjected to wafer sheath voltages as small as approximately 200–300volts due to energetic particle bombardment or radiation. Unfortunately, such voltages are of smaller magnitude than the voltages to which the circuit components are subjected during standard integrated circuit fabrication processes.

Structures such as MOS capacitors and transistors fabricated for advanced devices have very thin (thickness<200 Angstroms) gate oxides. These devices may be damaged by charge-up, resulting in gate breakdown. This can occur in a plasma process when neutralization of surface charge does not occur, by non-uniform plasma potential/or density, or by large RF displacement currents. Conductors such as interconnect lines may be similarly damaged.

RF Systems

Consider first prior art semiconductor processing systems such as CVD (chemical vapor deposition) and RIE (reactive ion etching) reactor systems. These systems may use radio frequency energy at low frequencies from about 10–500 Khz up to higher frequencies of about 13.56–40.68 Mhz. Below about 1 Mhz, ions and electrons can be accelerated by the oscillating electric field, and by any steady state electric field developed in the plasma. At such relatively low frequencies, the electrode sheath voltage produced at the wafers typically is up to one or more kilovolts peak, which is much higher than the damage threshold of 200–300 volts. Above several Mhz, electrons are still able to follow the changing electric field. More massive ions are not able to follow the changing field, but are accelerated by steady state electric fields. In this frequency range (and at practical gas pressures and power levels), steady state sheath voltages are in the range of several hundred volts to 1,000 volts or more.

Magnetic Field-Enhancement

A favorite approach for decreasing the bias voltage in RF systems involves applying a magnetic field to the plasma. This B field confines the electrons to the region near the surface of the wafer and increases the ion flux density and ion current and, thus, reduces the voltage and ion energy requirements. By way of comparison, an exemplary non-magnetic RIE process for etching silicon dioxide might use RF energy applied at 13.56 Mhz, an asymmetrical system of 10–15 liters volume, 50 millitorr pressure and an anode area to wafer-support cathode area ratio of approximately (8–10) to 1, and develop wafer (cathode) sheath voltage of approximately 800 volts. The application of a magnetic field of 60 gauss may decrease the bias voltage approximately 25–30 percent, from 800 volts to about 500–600 volts, while increasing the etch rate by as much as about 50 percent.

However, the application of a stationary B field parallel to the wafer develops an E×B ion/electron drift and an associated plasma density gradient which is directed diametrically across the wafer. The plasma gradient causes non-uniform etching, deposition and other film properties across the wafer. The non-uniformities may be decreased by rotating the magnetic field around the wafer, typically either by mechanical movement of permanent magnets, or by using pairs of electromagnetic coils which are driven in quadrature, 90 degrees out of phase, or by instantaneously controlling the current in pairs of coils to step or otherwise move the magnetic field at a controlled rate. However, although rotating the field reduces the non-uniformity gradient, typically some degree of non-uniformity remains.

Furthermore, it is difficult to pack coils and, in particular, to pack two or more pairs of coils about a chamber and to achieve a compact system, especially when using a Helmholtz coil configuration and/or a multi-chamber system of individual magnetic-enhanced reactor chambers surrounding a common loadlock.

A unique reactor system which has the capability to instantaneously and selectively alter the magnetic field strength and direction, and which is designed for use in compact multi-chamber reactor systems, is disclosed in commonly assigned U.S. Pat. No. 4,842,683, issued Jun. 27, 1989, in the name of inventors Cheng et al.

Microwave/ECR Systems

Microwave and microwave ECR (electron cylotron resonance) systems use microwave energy of frequencies >800 MHz and, typically, frequencies of 2.45 GHz to excite the plasma. This technique produces a high density plasma, but low particle energies which may be below the minimum reaction threshold energy for many processes, such as the reactive ion etching of silicon dioxide. To compensate, energy-enhancing low frequency electrical power is coupled to the wafer support electrode and through the wafer to the plasma. Thus, the probability of wafer damage is decreased relative to previous systems.

Microwave and microwave ECR systems operated at practical power levels for semiconductor wafer processing such as etch or CVD require large waveguides for power transmission, and expensive tuners, directional couplers, circulators, and dummy loads for operation. Additionally, to satisfy the ECR condition for microwave ECR systems operated at the commercially available 2.45 GHz, a magnetic field of 875 gauss is necessary, requiring large electromagnets, large power and cooling requirements.

Microwave and microwave ECR systems are not readily scalable. Hardware is available for 2.45 GHz, because this frequency is used for microwave ovens. 915 MHz systems are also available, although at higher cost. Hardware is not readily or economically available for other frequencies. As a consequence, to scale a 5–6 in. microwave system upward to accommodate larger semiconductor wafers requires the use of higher modes of operation. This scaling at a fixed frequency by operating at higher modes requires very stringent process controls to avoid so-called mode flipping to higher or lower order moads and resulting process changes. Alternatively, scaling can be accomplished, for example, for a 5–6 in. microwave cavity, by using a diverging magnetic field to spread out the plasma flux over a larger area. However, this method reduces effective power density and thus plasma density.

SUMMARY OF THE INVENTION

In one aspect, my invention which satisfies the above and other criteria is embodied in a system for processing a workpiece in an enclosure defining a vacuum processing chamber by introducing process gas into the chamber and generating a plasma from the gas, comprising: electrode means for coupling AC electrical energy into the chamber to generate a plasma in the gas; and means for applying high frequency VHF/UHF electrical energy to the electrode means for controlling the density of the plasma and the plasma ion density.

In addition, my invention encompasses an embodiment wherein the electrode means is adapted for applying relatively lower frequency AC electrical energy to the electrode means for controlling the sheath voltage associated with the electrode means and plasma ion energy. Preferably, the frequency of the high frequency AC energy is within the range of about 50 MHz to about 800 MHz, and that of the relatively lower frequency AC energy is within the range of about 0.1 MHz to about 50 MHz.

In another aspect, the electrode means comprises two electrode structures for applying plasma generating AC electrical energy to the chamber, the means for applying the high frequency AC electrical energy is connected to one of the electrode structures and the means for applying the relatively lower frequency AC electrical energy is connected to the other of the two electrode structures.

In yet another aspect, the enclosure includes a dielectric window in one surface thereof; the electrode means includes a wafer support electrode within the chamber and a plate electrode on the dielectric window; the means for applying the relatively low frequency AC energy is connected to the wafer support electrode; the means for applying high frequency AC energy is connected to the chamber enclosure; the plate electrode is at system ground; and both means for applying AC electrical energy are referenced to the plate electrode as ground, such that the electrodes form an electric field in the chamber between the wafer support electrode and the plate electrode.

In an alternative embodiment, the electrode means is a single electrode structure located within the chamber and adapted for supporting a workpiece, and both means for applying AC electrical energy to the electrode means are connected to the single electrode structure.

In another alternative embodiment, the enclosure includes a dielectric window in one surface thereof; the electrode means includes a wafer support electrode within the chamber and a plate electrode on the dielectric window; the means for applying high frequency AC electrical energy is connected to the plate electrode; the means for applying the relatively low frequency AC energy is connected to the wafer support electrode; and both means for applying AC energy are referenced to the chamber enclosure as ground, such that the electrodes form an electric field in the chamber between the wafer support electrode and the plate electrode.

In a presently preferred embodiment, the electrode means includes an electrode located within the chamber and adapted for supporting a workpiece thereon and an electrode structure surrounding the periphery of the plasma chamber; the means for applying high frequency AC energy is connected to the peripheral electrode structure; and the means for applying relatively lower frequency AC energy is connected to the wafer support electrode. Preferably, the enclosure includes a dielectric dome internally defining a section of the chamber; the peripheral electrode structure surrounds the chamber section defined within the dome; the peripheral electrode structure and the wafer support electrode are positioned for forming an electric field in the chamber parallel to the wafer support electrode; and the surrounding electrode structure comprises separate sections and, in combination with the means for applying the high frequency AC electrical energy, provides a differentially driven, ungrounded, balanced drive arrangement for the electrode structure.

In still additional embodiments, the enclosure/chamber according to my invention includes an integral transmission line structure adapted to apply AC electrical energy of selected frequency from the external source to the plasma chamber, comprising: the wafer support electrode; an outer conductor surrounding the wafer support electrode; and an insulator between the wafer support electrode and the outer conductor such that AC energy applied to the transmission line structure is coupled along the wafer support electrode for controlling the cathode sheath voltage. Also, the high frequency AC electrical energy can be coupled to the electrode means via a matching network. In addition, a biased grid can be incorporated for extracting a stream of charged ions or electrons from the plasma, and a neutralization grid can be located spaced from the extraction grid for extracting a stream of excited neutrals and free radicals.

Other, preferred aspects include a reflector positioned surrounding the electrode means, for preventing radiation of the AC energy into free space.

Magnetic enhancement may be supplied by peripheral permanent or electromagnet arrangements which apply a controlled static magnetic field orthogonal to the plane of the electric field of the surrounding electrode, selected from uniform, diverging and magnetic mirror configurations, for controlling the location of and the transport of the plasma downstream relative to the wafer. Also, magnets may be mounted around the chamber for applying a multipolar cusp field to the chamber in the vicinity of the wafer for confining the plasma to the wafer region while substantially eliminating the magnetic field across the wafer. In addition, a magnetic shunt may be positioned surrounding the wafer and the wafer support electrode for diverting any magnetic field from the wafer support electrode.

The system construction permits scaling of its size by selecting the frequency of operation.

In another aspect, my invention is embodied in the construction and operation of a plasma processing reactor, comprising: a housing including a dielectric dome defining a plasma chamber therein; electrode means within the plasma chamber for supporting a semiconductor wafer; a gas inlet manifold in the housing for supplying reactant gas to the plasma chamber; vacuum pumping means communicating with the plasma chamber for maintaining a vacuum therein; and a high frequency energy source comprising a split electrode surrounding the dome for capacitively coupling high frequency energy of controlled power into the plasma chamber for generating a plasma therein of controlled density and controlled ion flux density. As mentioned, this system may incorporate various preferred and alternative features, including, preferably, an energy source for coupling lower frequency energy of controlled power into the chamber for controlling the sheath voltage at the wafer support. The bias frequency is selected to control voltage; bias power is selected/varied, to control sheath voltage and ion energy.

In other, process aspects, my invention is embodied in a process for coupling high frequency energy into a processing chamber within a vacuum enclosure, preferably via a split electrode surrounding a dielectric dome portion of the enclosure, for generating a plasma within the chamber to effect fabrication of materials selected from etching of materials, deposition of materials, simultaneous etching and deposition of materials and/or sequential etching and deposition of materials. Alternatively, the high frequency power is applied via a plate electrode formed on a dielectric window in the enclosure. The process also involves controlling the high frequency power to control plasma density and ion flux density. Preferably, the object undergoing fabrication is supported on an electrode and relatively lower frequency AC power is applied to the electrode for independently controlling the associated sheath voltage and the ion energy, with respect to plasma density and ion flux density.

Specific process aspects include but are not limited to etching oxide, including etching contact holes in oxide formed over polysilicon (polycrystalline silicon) and etching via holes in oxide formed over aluminum; so-called "light" etching of silicon oxide and polysilicon; high rate isotropic and anisotropic oxide etching; etching polysilicon conductors such as gates; photoresist stripping; anisotropic etching of single crystal silicon; anisotropic photoresist etching; low pressure plasma deposition of nitride and oxynitride; high pressure isotropic conformal deposition of oxide, oxynitride and nitride; etching metals, such as aluminum and titanium, and compounds and alloys thereof; and sputter facet deposition, locally and globally, and with planarization.

BRIEF DESCRIPTION OF THE DRAWING

The above and other aspects of my invention are described with respect to the drawing in which:

FIG. 5 is a block diagram of a presently preferred power control system;

DETAILED DESCRIPTION OF THE PREFERRED EMBODIMENT(S)

1. Overall System

Figure 1:
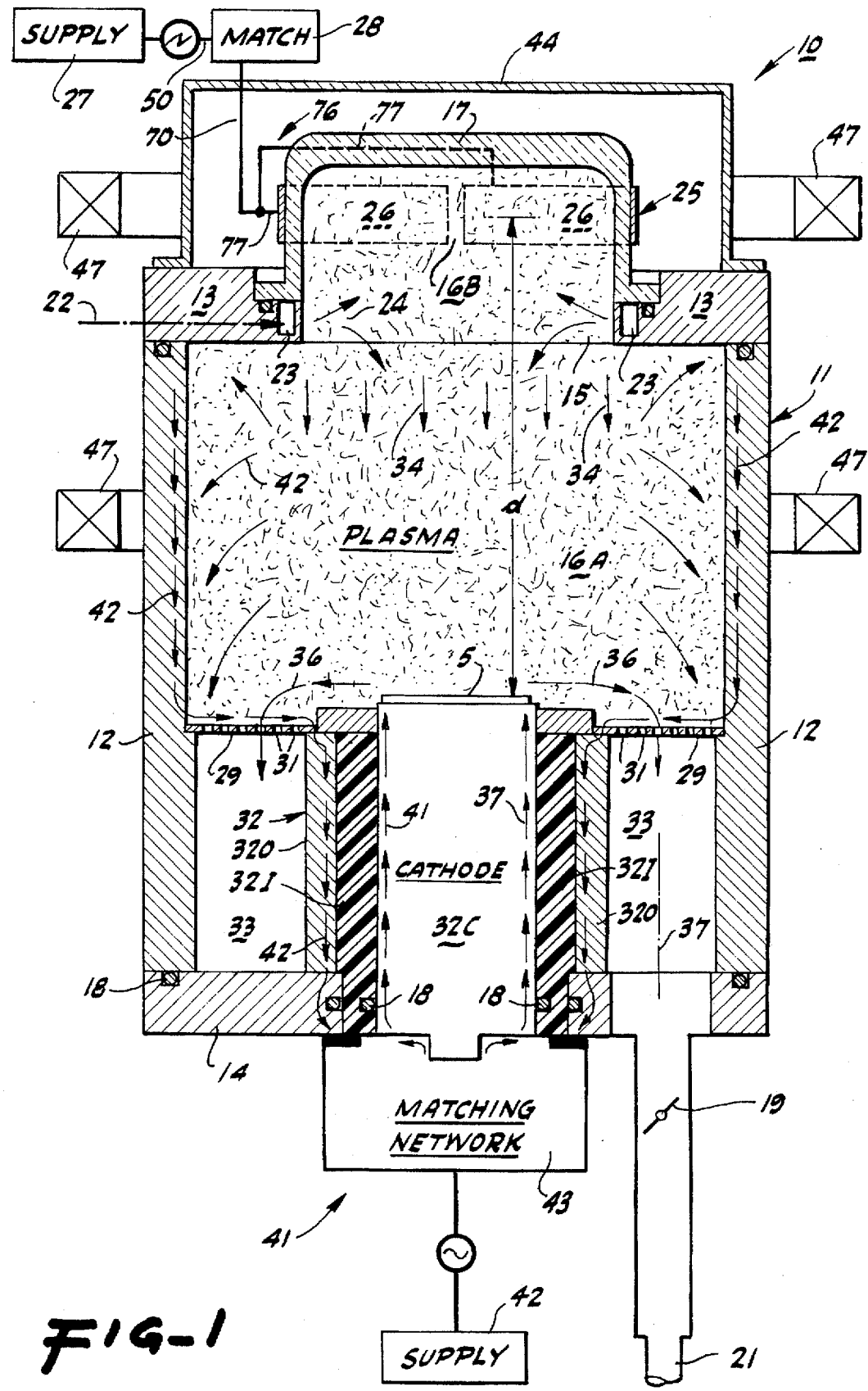
FIG. 1 schematically depicts an RF reactor system in accordance with my present invention.

FIG. 1 is a schematic sectional view of a plasma reactor chamber system 10 which uses a plural (two or more) electrode plasma source arrangement, a magnetically-enhanced plasma source arrangement and other aspects of my present invention. The exemplary chamber is a modification of that depicted in my incorporated U.S. Pat. No. 5,210,466, which includes an integral transmission line structure. The salient features of my invention are applicable generally to plasma reactor chambers. Furthermore, it will be understood by those of skill in the art and from the description below that various features of the invention which cooperatively enhance the performance of the reactor system may be used separately or may be selectively omitted from the system. For example, the process conditions provided by the plural (two or more) electrode plasma source arrangement frequently eliminate any need for magnetic enhancement.

The exemplary system 10 includes a vacuum chamber housing or enclosure 11, formed of anodized aluminum or other suitable material, having sidewalls 12 and top and bottom walls 13 and 14. Anodized aluminum is preferred because it suppresses arcing and sputtering. However, other materials such as bare aluminum and process-compatible polymers or quartz or ceramic liners can be used. The chamber can be heated or cooled for process performance. Top wall or ceiling 13 has a central opening 15 between a lower chamber section 16A defined between walls 12—12 and an upper chamber section 16B defined by a dielectric dome 17. The dome preferably is quartz but can be made of several dielectric materials, including alumina and alpha-alumina (sapphire). The dome may be heated or cooled as required for process performance. A fluid or gas heat transfer medium may be used, or heating elements may be used to heat the dome directly. Various vacuum seals 18 such as O-rings are interposed between the various mating surfaces to maintain vacuum-tight enclosure. The interior of the chamber housing 11 (chamber 16) is evacuated via a throttle valve 19 (which regulates pressure independent of flow rate) in a vacuum line 21 which connects to a vacuum pumping system (not shown).

Reactant gases are supplied to the chamber 11, as indicated schematically at 22, typically from one or more sources of pressurized gas via a computer-controlled flow controller (not shown) and enter the internal vacuum processing chamber 16 through ring gas manifold 23, which is mounted on the inside of or integral with, top wall 13. The manifold 23 preferably supplies etching gas and/or deposition gas at a slight upward angle to the chambers/chamber sections 16B and 16A for developing an etching and/or deposition plasma upon application of high frequency RF energy. Gases may be brought in directly via the process chamber instead of, or in addition to, through the manifold. For example, it may be desired to bring an inert gas or other gas into the manifold 23, and bring other reactant gases in via a lower manifold or gas inlet (not shown) in the process chamber below.

The high frequency (HF) energy such as, preferably, VHF/UHF energy of frequency 50 to 800 MHz is applied by a substantially closed, split electrode structure 25 comprising a pair of generally semi-circular band electrodes 26—26, which surround the dome 17 and are powered by a high frequency (HF) source 27, and effect plasma excitation in the chamber 16 by capacitive coupling via the dielectric dome 17. This contrasts with conventional RF system arrangements, in which the RF power is applied between two electrodes, typically the wafer support electrode 32C, the upper surface of which supports wafer 5, and a second electrode which is defined by the sidewalls 12, top wall 13 and/or manifold 23 of the reactor chamber.

Figure 9:
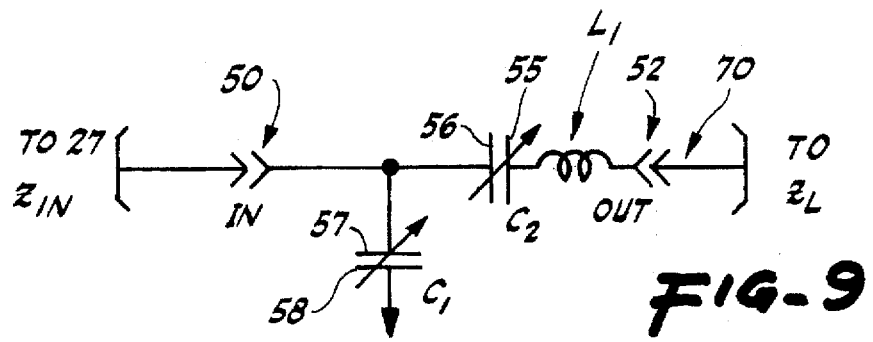
FIG. 9 is an electrical schematic of a presently preferred matching network for the preferred, differentially driven, ungrounded, balanced split electrode arrangement of FIG. 1.
Figure 10:
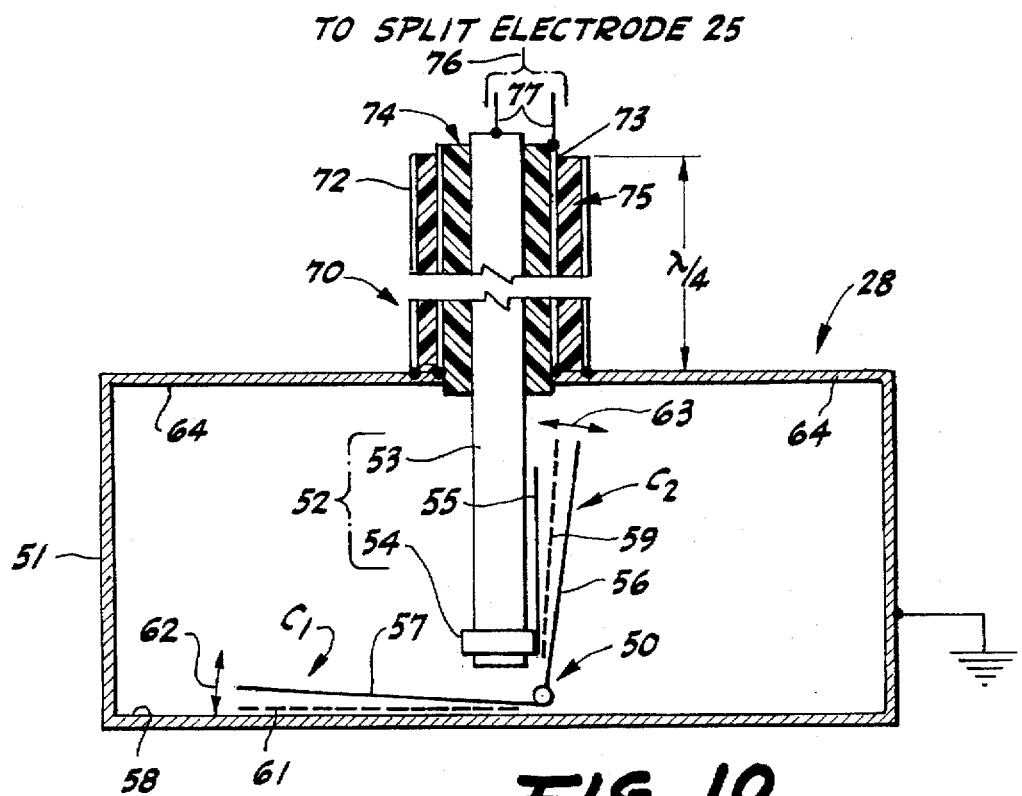
FIG. 10 is a schematic physical equivalent of FIG. 9.
Figure 11:
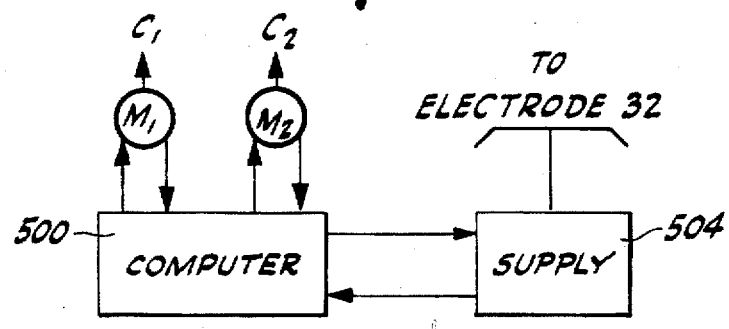
FIG. 11 is a simplified schematic depiction of a motor control circuit for the network of FIGS. 9 and 10.

Preferably, the HF AC source 27 is coupled to the electrode 25 by a suitable matching network 28 via a transmission line structure having twin leads 77—77 coupled to the band electrodes 26—26 to provide a differentially driven, balanced, ungrounded drive arrangement. This system is shown in FIGS. 9–11 and described more fully in §3 below.

Preferably, the gas flow from the upper chamber section 16B is downward toward the wafer 5 and is then pumped radially outward from the wafer. To this end, an annular vacuum manifold 33 is defined about cathode transmission line structure 32, between chamber wall 12 on one side and the outer transmission line conductor 320 on the other, and between the chamber bottom wall 14 on the bottom and a conductive pumping screen 29 on the top. The manifold screen 29 is interposed between the vacuum manifold 33 and the plasma chamber 16A and provides a conductive electrical path between chamber walls 12 and the outer conductor 320 of the transmission line structure 32. The manifold 33 defines an annular pumping channel for implementing uniform radial pumping of exhaust gases from the periphery of wafer 5. The exhaust manifold 33 communicates into the exhaust gas system line 21 via one or more apertures 31 in the bottom wall 14. The overall gas flow is along path 22 into the inlet manifold 23, along path 24 into the upper (and)lower chamber section, along path 34 from the upper chamber section 16B toward wafer 5, along path 36 radially outwardly from the peripheral edge of the wafer and through screen 29 into the gas outlet manifold 33, and along path 37 from the exhaust manifold 33 to the exhaust system 21.

The split electrode structure 25 is positioned adjacent the dome 17 and the plasma chamber 16B for coupling the relatively high frequency (HF) energy into the chamber and forming a changing electric field between the two band electrodes in a generally right cylinder volume therein parallel to the top surface of the wafer support electrode 32C and the wafer 5 thereon. The changing electrical fields energize the process gas and thus form a plasma in chamber 16 (numeral 16 collectively designates the chamber 16A and 16B and the plasma therein) characterized by relatively high density and low energy ions. The plasma is generated in the dome concentrated in the above-mentioned right cylindrical volume defined by the electrode 25 and active species including ions, electrons, free radicals and excited neutrals move downstream toward the wafer by diffusion and by bulk flow due to the prevailing gas flow described herein. Also, an appropriate magnetic field can be used to extract ions and electrons toward the wafer as described below. Optionally, but preferably, a low frequency bias energy input arrangement 41 comprising a source 42 and a bias matching network 43 couples relatively low frequency (LF) RF energy to the wafer support electrode 32C for selectively increasing the plasma sheath voltage at the wafer and thus selectively increasing the ion energy at the wafer. Preferably, the LF energy is within the range of about 0.1 MHz to about 50 MHz.

A reflector 44 which essentially is an open-bottom box encloses the split electrode 25 at the top and sides but not at the bottom. The reflector prevents radiation of the HF energy into free space and thereby concentrates the radiation and dissipation of the power in the plasma to enhance efficiency.

As described in greater detail below, optionally, one or more electromagnets 47—47 or permanent magnets are mounted adjacent the chamber enclosure 11 for providing a static shaped-magnetic field for enhancing the density of the plasma at the wafer 5.

In short, my invention uses relatively high frequency electrical energy, typically 50 MHz to 800 MHz (high frequency relative to the optional bias energy but typically much lower than microwave or microwave-ecr frequencies), to produce directed, generally horizontal fields inside a vacuum chamber for generating a plasma characterized by high density and relatively low energy, without coupling potentially damaging HF energy through the wafer 5. In the preferred downstream plasma source arrangement illustrated in FIG. 1, the energy is fully absorbed remote from the wafer, with high plasma density, ensuring that the energy does not propagate to the wafer and thus minimizing the probability of damage. Selectively, and optionally, relatively low frequency (LF) auxiliary AC bias energy is applied to the wafer support electrode 32C for increasing the wafer sheath voltage and, thus, the ion energy as required. The (1) HF energy and (2) LF energy independently control (1) plasma density and ion density and (2) sheath voltage and ion energy.

The frequency of the system may be varied within the range 50 to 800 MHz to permit scaling the diameter of chamber 16B over the range 32 in. to 2 in. In particular, the system can be scaled upward to accommodate the increasingly large diameter wafers favored by the semiconductor industry, without changing the electromagnetic mode, by the simple expedient of decreasing the frequency within the described range and retaining low mode operation, thus avoiding the possibility of mode flipping and process changes which are associated with increasing the mode of operation.

Because the high frequency of the source 27 driving the split electrode structure 25 is nonetheless much lower than the frequencies used in microwave or microwave-ECR applications, the optional smaller magnets operated at lower DC current by less expensive power supplies can be used, with associated smaller heat loads. In addition, as is obvious from the above discussion, a twin lead transmission line can be used instead of wave guides. In addition, the plasma non-uniformities caused by the E×B electron drift in other magnetic-enhanced or assisted systems are absent here, because the applied magnetic fields (both the magnetic component of the HF field applied via the electrode 25 and any static axial magnetic field applied by magnets 47), are substantially parallel to the electric field at the cathode 32C. Thus, there is no E×B drift in the system.

A magnetic shunt path formed with a high permeability material may be used to allow a B field in the source (upper chamber 16A) but not at the wafer.

Optionally, permanent or electromagnets can be placed in a multi-polar arrangement around the lower chamber 16A, typically in an alternating pole north-south-north-south ... north-south arrangement, to generate a multi-cusp magnetic mirror at the chamber walls. The magnets may be vertical bar magnets or preferably horizontal ring magnets, for example. Such magnets may be used to reduce electron losses to the walls, thus enhancing plasma density, without subjecting the wafer to magnetic fields.

2. Magnetic Enhancement

As mentioned above, one or more (preferably, at least two) permanent or electromagnets 47—47 define a static, generally axial magnetic field orthogonal to and through the plane of the of the E field of the split electrode 25. Preferably, one of three field-types is used: uniform, divergent or magnetic mirror.

Figure 8A:
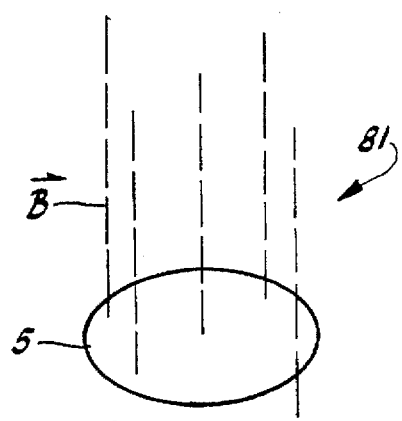
FIGS. 8A–8D depict various magnetic enhancement fields.

Referring to FIG. 8A, a homogeneous, axial uniform magnetic field 81 applied orthogonally to the wafer 5 restricts the motion of the electrons to the walls. Because of the inability of ions to follow high frequency field variations, the ions follow the electron deficiency, and are concentrated in the plasma over the wafer. For maximum efficiency, this and other static magnetic fields can be tuned to resonance with the high frequency electromagnetic field: $\omega=2\pi F=Be/m$, where B is the magnetic flux density and e and m are the electron charge and mass, respectively.

Figure 8B:
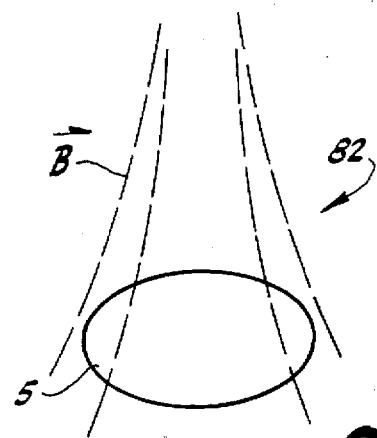

An axially divergent field 82 is depicted schematically in FIG. 8B. By the conservation of magnetic moment, the axial gradient of the magnetic field converts circular translational energy to axial translational energy and tends to drive the electrons and ions from the stronger field regions to the weaker regions thereof. Diverging magnetic fields can be used to push the electrons and ions from the plasma generating regions and to concentrate the plasma at the wafer.

Figure 8C:
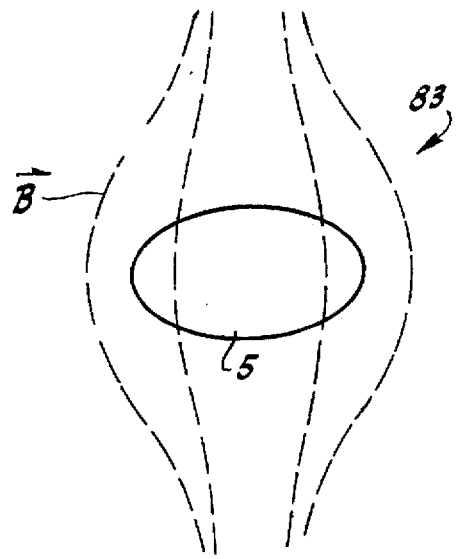
Figure 8D:
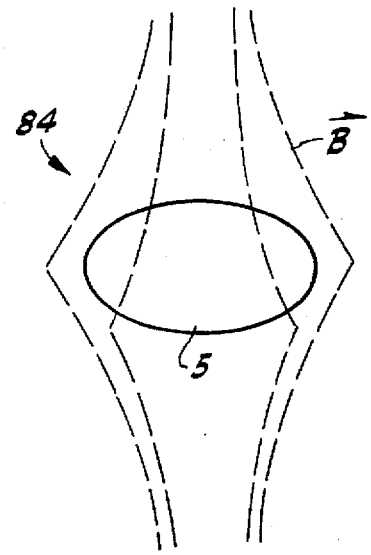

Referring to FIGS. 8C and 8D, there are shown, respectively, a bulging or aiding magnetic field 83 (FIG. 8C) and a cusp-shaped or opposing field 84 (FIG. 8D). The effect of each of these so-called "magnetic mirror" fields is similar to that of the axially divergent field: charged particles are driven from the relatively strong field regions (at the ends here) toward the relatively weak central region.

Selectively positioning the magnet(s) and selecting and varying the strength of the fields provided by the single magnet or cooperating magnets shapes the associated uniform, diverging, or magnetic mirror field in controlled fashion to increase the density of the plasma at the wafer. For magnetic mirror fields, the preferred wafer position for maximum plasma density enhancement is closely adjacent to or at the bulge or cusp, to provide maximum plasma density enhancement.

It may be desired to utilize an axial magnetic field at the plane of the split electrode 25 to enhance plasma generation, but to eliminate the magnetic field at the wafer 5. An annular disk of high magnetic permeability materials (such as nickel or steel for soft iron) may be interposed below the magnet(s) and plane of the split electrode 25 but above the wafer 5. Optionally, multipolar confinement may be used in the lower chamber region by defining ring or bar magnets in an alternating pole arrangement.

3. Split Electrode Matching Network 28

To implement the split electrode embodiment depicted in FIG. 1 a matching network is required to match the plasma load impedance presented to the split electrode 25 and to the generator 27. In addition, it is desired to drive the split electrode 25 differentially, in an ungrounded, balanced (with respect to ground) fashion. Driving the electrodes in this manner produces the most uniform plasma, and minimum particle energy.

The preferred matching network 28 is a modified embodiment of the matching network described in above-mentioned co-pending, commonly assigned U.S. Pat. No. 5,210,466 the disclosure of which patent is hereby incorporated by reference. Referring to FIGS. 9 and 10, in addition to FIG. 1, the presently preferred matching network 28 is an L-network comprising a shunt capacitor $C_1$ coupled from the input of the matching network to ground and a series capacitor $C_2$ coupled from the input of the matching network to the output of the matching network, which ties directly to the output transmission line section 70.

It should be noted that the matching network configuration depicted in FIGS. 9 and 10 applies for a typical source output resistive impedance of 50 ohms and the typical plasma 16 resistive impedance component of 1 to 50 ohms and, more generally, when the source output resistance component is greater than the load resistance component. Were the resistive part of the plasma load impedance $Z_1$ to exceed the output resistive impedance of the source, the input and the output connections for the matching network would be reversed.

Capacitors $C_1$ and $C_2$ are air capacitors which comprise fixed and movable conductor plates, typically formed of copper or silver plated cooper sheets. The fixed plate 58 of capacitor $C_1$ is the case or housing 51 of the matching network 28, which is connected to ground. Referring also to FIG. 11, plate 57 is connected to the input 50 from the power supply 27 and is movable along path 62 by motor $M_1$ under the control of the system controller 500, based upon the real time $Z_{in}$ or reflected power. This input is used in controlling the plate separation and, thus, the capacitance of the capacitors in a well-known manner. A sheet 61 of Teflon™ or other suitable low loss, high dielectric strength material is interposed between the capacitor plates 57 and 58 to prevent arcing. Please note, as indicated schematically in FIG. 11, the computer 500 (or a separate computer) is conveniently used to control the operation of the power supply 27 and to select a proper frequency within the range of interest and thereby select the desired voltage and power combination for a given process.

Similarly-constructed series capacitor $C_2$ comprises an insulative, anti-arcing sheet 59 of material such as Teflon™, a leg 56 which is connected to the input 50 and is movable by motor $M_2$, in the manner of capacitor $C_1$, along path 63 to vary the capacitance of $C_2$. A fixed leg 55 is connected to the matching network's output 52, which illustratively comprises a clip 54 which engages the downward-extending conductor post or conductor 53. The conductor 53 is also part of the balun output section 70. Post 53 is extended to add inductance as indicated at $L_1$, of FIG. 9.

The balun 70 converts the grounded match output to a balanced, differential ungrounded output. A 1:1 balun is used. The tri-axial, electrically quarter wave output section 70 comprised of center conductor (post) 53, outer conductor 73, shield 72 and dielectric 74 and 75 is used to isolate the split electrode 25 from ground by presenting a high impedance to any ground current. Balun 70 is terminated via split conductor 76, specifically the two leads 77—77 thereof, which connect to the individual conductors 26—26 of the split electrode 25.

4. Transmission Line Structure 32

As described in detail in my incorporated U.S. Pat. No. 5,210,466, proper coaxial/transmission line design requires both a feed via a low characteristic impedance, short transmission line from the matching network to the wafer and a return path along the transmission line. This design requirement is satisfied by the integral transmission line structure 32 depicted in FIG. 1 which comprises the cathode 32C, concentric annular conductor 320, and a non-porous low loss insulator 32I which surrounds the cathode 32C and insulates the cathode from the concentric annular conductor 320 and displaces process gases which otherwise might break down. For example, Teflon™ or quartz materials are preferred because they have high dielectric strength, low dielectric constant and low loss. The input side of this structure is connected to the matching network in a manner described below. The insulated cathode 32C and outer conductor 320 provide separate current paths between the matching network 43 and the plasma 16. One reversible current path 41 is from the matching network along the outer periphery of the cathode 32C to the plasma sheath at the chamber (electrode) surface. The second reversible path 42 is from the plasma 16 along the upper inside section of chamber walls 12 then along the conductive exhaust manifold screen 29 and via the inside of the outer conductor 320 to the matching network. Please note, the exhaust manifold screen 29 is part of the uniform radial gas pumping system, and the return path for the RF current.

During application of alternating current energy, the RF current path alternates between the directions shown and the reverse directions. Due to the co-axial cable type of construction of the transmission line structure 32 and, more specifically, due to the higher internal impedance of the cathode 32C (relative to the outside thereof) and the higher impedance toward the outer surface of the conductor 320 (relative to the inner surface thereof), the RF current is forced to the outer surface of the cathode 32C and to the inner surface of the outer conductor 320, in the manner of a co-axial transmission line. Skin effect concentrates the RF current near the surfaces of the transmission line, reducing the effective cross-section of the current path. The use of large wafers, for example, wafers 4–8 inches in diameter and the commensurately large diameter cathode 32C and large diameter outer conductor 320 provide large effective cross-section, low impedance current paths along the transmission line structure.

Also, if the co-axial-type transmission line structure 32 were terminated in a pure resistance equal to its characteristic impedance $Z_0$, then the matching network would see the constant impedance $Z_0$, independent of the length of the transmission line. However, such is not the case here, because the plasma is operating over a range of pressure and power, and comprises different gases, which collectively vary the load impedance $Z_1$ that the plasma presents to the end of the transmission line 32. Because the load $Z_1$ is mismatched from the non-ideal (i.e., non-lossless) transmission line 32, standing waves present on the transmission line will increase resistive, dielectric, etc., losses between the transmission line and the matching network 31. Although the matching network 43 can be used to eliminate any standing waves and subsequent losses from the input of the matching network back to the amplifier or power supply 30, the matching network, transmission line feed 32 and plasma inside the chamber comprise a resonant system that increase the resistive, dielectric, etc., losses between the transmission line 32 and the matching network 43. In short, the load impedance $Z_1$ will be mismatched with losses, but losses are minimum when $Z_1 \sim Z_0$.

To diminish the losses due to the load mismatch, the co-axial-type transmission line structure 32 is designed to have a characteristic impedance $Z_0$ that is best suited to the range of load impedances associated with the plasma operation. Typically, for the above-described operating parameters (example: wafer support electrode or bias frequency range approximately 5–50 MHz) and materials of interest, the series equivalent RC load impedance, $Z_1$, presented by the plasma to the transmission line will comprise a resistance within the approximate range 1 ohm to 30 ohms and a capacitance within the approximate range 50 pico farads to perhaps 400 pico farads. Consequently, as the optimum, a transmission line characteristic impedance $Z_0$ is selected which is centered within the load impedance range, i.e., is approximately 10 to 50 ohms.

It is necessary that the transmission line 32 be very short in order to avoid transformation of the plasma impedance that the matching network sees. Preferably, the transmission line is much less than a quarter wavelength, $\lambda/4$, and, more preferably, is about (0.05 to 0.1) $\lambda$. More generally, if it is not possible to locate the matching network at a distance much less than a quarter wavelength to the load, advantage is taken of the half wavelength periodicity associated with the impedance transformation by using a transmission line length equal to an integral multiple n=1, 2, 3, etc., of a half wavelength ($\lambda/2$; $\lambda$; $3\lambda/2$; etc.). More precisely, the preferred values are $\lambda/2$ to ($\lambda/2+0.05\lambda$); $\lambda$ to ($\lambda+0.05\lambda$); $3\lambda/2$ to ($3\lambda/2+0.05\lambda$); etc.). Under such conditions, the matching network should not be located at odd integrals of quarter wavelengths ($\lambda/4$, $3\lambda/4$, $5\lambda/4$), because a quarter wave section (or n $\lambda/4$ where n is odd) transforms $Z_1$ such that $Z_{in}=Z_0{}^2/Z_1$, where $Z_1$ is typically small, producing a very large $Z_{IN}$. The matching network then could not match to the plasma load and it would be very difficult to couple power to the plasma without unacceptable system resonance and power dissipation.

Also, for efficient coupling of power, the inside diameter (cross-section dimension) of the return conductor 320 should not be significantly larger than the outside diameter (cross-section dimension) of the center conductor 32C.

In short, the chamber optionally but preferably incorporates a transmission line structure that couples power from the matching network 43 to the plasma 16. That transmission line structure (1) preferably is very short compared to a quarter wavelength at the frequencies of interest or, alternatively, is approximately equal to an integral half wavelength, to prevent undesirable transformation of the plasma impedance; (2) has a characteristic $Z_0$ selected to suppress losses due to the presence of standing waves on the line between the plasma and the matching network; and (3) uses an outside conductor path cross-sectional dimension which is not substantially larger than that of the center conductor.

5. Control System

The following descriptions are used here in reference to the control system depicted in FIG. 5:

| | | |
|---|---|---|
| Psp: | Power set point | |
| $P_f$: | Forward power | Measured by directional coupler located at /inside power supply |
| $P_r$: | Reflected power | Measured by directional coupler located at /inside power supply |
| Zl: | Magnitude of impedance | |
| <phi: | Phase of impedance | |
| Tsp: | Tune set point | |
| Lsp: | Load set point | |
| Tfb: | Tune feedback (measured) | |
| Lfb: | Load feedback (measured) | |

FIG. 5 is a block diagram of an exemplary system for controlling the various components including the power supplies. Here, a system controller 500 is interfaced to surrounding (or split or top) electrode power supply 27, impedance bridge 502, matching network 28, electrode 25, bias power supply 504, impedance bridge 505, matching network 43, and cathode 32C. The process parameters top electrode power and DC bias, selected for ion flux density and ion energy, are supplied as input to the controller 500. Controller 500 may also control other parameters such as gas flow(s), chamber pressure, electrode or wafer temperature, chamber temperature, and others. The controller 500 may preset initial tune$_1$ and load$_1$ conditions by issuing signals on Tsp$_1$ and Lsp$_1$ lines connected to matching network 28. The controller 500 may also preset initial tune$_2$ and load$_2$ conditions by issuing signals on Tsp$_2$ and Lsp$_2$ lines connected to the matching network 43. Typically, these conditions are selected to optimize plasma initiation (gas breakdown). Power may be applied first to either the electrode 25 or to the cathode 32, or it may be applied simultaneously to both. The controller issues power set points on Psp$_1$ line to power supply 27 and on Psp$_2$ line to bias power supply 504 simultaneously or sequentially (in either order).

Avalanche breakdown occurs rapidly in the gas, generating a plasma. Controller 500 monitors forward power ($P_{f1}$) and reflected power ($P_{r1}$) to/from the electrode 25, and monitors forward power ($P_{f2}$) and reflected power ($P_{r2}$) to/from the cathode 32. DC bias (cathode to anode DC voltage) is also monitored as shown by controller 500. Controller 500 adjusts the electrode tune$_1$ and load$_1$ parameters by issuing set points on lines Tsp$_1$ and Lsp$_1$, based on either (a) forward power $P_{f1}$ and reflected power $P_{r1}$, or (b) impedance magnitude $|Z_1|$ and impedance phase <phi$_1$. Bridge 502 furnishes impedance magnitude and phase angle information to the controller. The electrode 25 is matched when reflected power $P_{r1}$ is substantially zero and when the impedance (magnitude and phase $|Z_1|$<phi) is the complex conjugate of the top electrode power supply output impedance. (The zero reflected power condition and the conjugate impedance condition occur simultaneously, so either reflected power may be minimized or impedances may be matched, with the same result. Alternatively, VSWR (voltage standing wave ratio) or reflection coefficient may be minimized. Controller 500 adjusts the cathode 32 and the matching network 43 tune$_2$ and load$_2$ parameters by issuing set points on the Tsp$_2$ and Lsp$_2$ lines, based on either (a) forward power $P_{f2}$ and reflected power $P_{r2}$ or (b) impedance magnitude $|Z_2|$ and impedance phase <phi$_2$. Bridge 505 furnishes impedance magnitude $|Z_2|$ and phase <phi$_2$ information to the controller 500. Matching occurs when, similarly to electrode matching, reflected power $P_{r2}$ is essentially zero, and when impedance (magnitude and phase $|Z_2|$<phi$_2$) is the complex conjugate of the bias power supply 504 output impedance. DC bias is monitored by controller 500, which varies the bias power supply's output power to obtain the desired measured DC bias. Controller 500 subtracts the measured value of DC bias from the desired value of DC bias. If the difference is negative, bias power supply 504 output is increased. If the difference is positive, bias power supply 504 output is decreased (higher bias power supply 504 output generates a more negative DC bias). Proportional, proportional-integral, or proportional-integral-derivative control or other control may be used in accordance with this method.

Alternatively, instead of the preferred embodiment of adjusting bias power supply 504 output to maintain a constant DC bias, a constant bias power supply 504 output may be used.

Controller 500 may be a central controller, or a distributed system of controllers.

6. Other Features

A preferred feature of the invention is to automatically vary "bottom" or support electrode bias power to maintain a constant cathode (wafer) sheath voltage. At low pressures (<500 mt) in a highly asymmetric system, the DC bias measured at the cathode is a close approximation to the cathode sheath voltage. Bottom power can be automatically varied as described in the previous section to maintain a constant DC bias and, thus, to maintain constant sheath voltage. Alternatively, bottom power can be used to selectively vary DC bias and sheath voltage. Bottom power has very little effect on plasma density and ion current density. Top electrode power has very strong effect on plasma density and on current density, but very small effect on cathode sheath voltage. Therefore, it is desired to use top power to define plasma and ion current densities, and bottom power to define cathode sheath voltage.

Features which may be incorporated in the reactor chamber system 10 include, but are not limited to, the use of a fluid heat transfer medium to maintain the internal and/or external temperature of the gas inlet manifold 23 above or below a certain value or within a certain range; the use of fluid heat transfer medium to heat or cool the cathode 32C; the use of fluid heat transfer medium to heat or cool chamber walls 12 or top 13; resistive heating of the cathode 32C; the use of a gas heat transfer medium between the wafer 5 and the cathode 32C; and mechanical or electrostatic means for clamping the wafer 5 to the cathode 32C. Such features are disclosed in commonly assigned U.S. Pat. No. 4,872,947, issued Oct. 10, 1989, and commonly assigned U.S. Pat. No. 4,842,683, issued Jun. 27, 1989, which are incorporated by reference.

The inventive plasma reactor system is depicted in FIG. 1 in the conventional orientation, that is vertically, with the substrate 5 residing on an electrode 32 (cathode) and an electrode 25 located above the electrode. For convenience, we sometimes refer here to the power supplied to the electrode 25 as "top" power and that supplied to the electrode/cathode 32 as "bias" or "bottom" power. These representations and designations are for convenience only, and it is to be understood that the described system may be inverted, that is, configured with the electrode 32 on top and the electrode 25 located below this electrode 32, or may be oriented in other ways, such as horizontally, without modification. In short, the reactor system works independently of orientation. In the inverted configuration, plasma may be generated at the electrode 25 and transported upwardly to the substrate 5 located above the electrode 25 in the same manner as described in the specifications. That is, transport of active species occurs by diffusion and bulk flow, or optionally assisted by a magnetic field having an axial gradient. This process does not depend on gravitational forces and thus is relatively unaffected by orientation. The inverted orientation may be useful, for example, to minimize the probability of particles formed in the plasma generation region in the gas phase or on a surface, falling to the substrate. Gravity then reduces the probability of all but the smallest of such particles moving upward against a gravitational potential gradient to the substrate surface.

My chamber design is useful for both high and low pressure operation. The spacing, d, between the wafer support cathode 32C and the plane of the electrode 25 may be tailored for both high and low pressure operation. For example, high pressure operation at 500 millitorr –50 torr preferably uses spacing d ≦about 5 centimeters, while for lower pressure operation over the range <0.1 millitorr-500 millitorr, a spacing d >5 centimeters may be preferable. The chamber may incorporate a fixed spacing d, as shown, or may utilize variable spacing designs such as interchangeable or telescoping upper chamber sections. The reactor system 10 is useful for processes such as high and low pressure deposition of materials such as silicon oxide and silicon nitride; low pressure anisotropic reactive ion etching of materials such as silicon dioxide, silicon nitride, silicon, polysilicon and aluminum; high pressure plasma etching of such materials; and CVD faceting involving simultaneous deposition and etchback of such materials, including planarization of wafer topography. These and other processes for which reactor system 10 may be used are described in commonly assigned U.S. Pat. application Ser. No. 07,560, 530, (AMAT file no. 151-2) now abandoned, filed on Jul. 31, 1990, in the name of Collins et al, which Collins et al patent application is incorporated by reference.

6. Alternative Electrode Configurations

Figures 2, 3, 4:
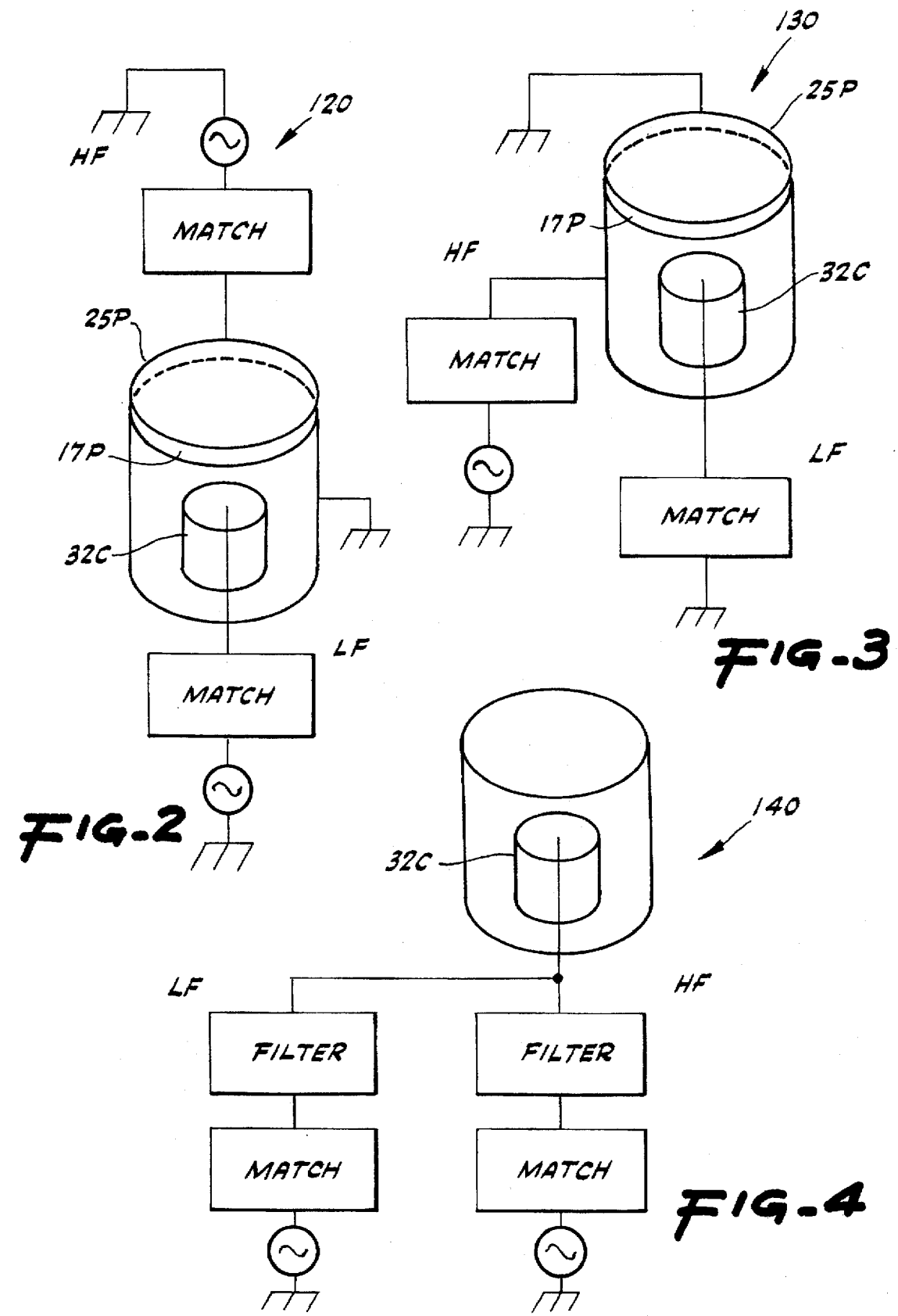
FIGS. 2, 3 and 4 schematically depict systems incorporating alternative electrode configurations.

FIG. 2 schematically depicts an alternative system 120 which is similar to the system 10, FIG. 1, except that a flat dielectric window 17P, instead of the dome 17, is formed in the top of the enclosure, and a flat high frequency electrode 25P (preferably formed on top of the window 17P) is used in place of the circular electrode 25. The FIG. 2 arrangement operates similarly to that of FIG. 1, except that the electric field is not so confined and is perpendicular to the plane of the wafer 5. As a result, the system 120 does not provide the damage suppression characteristics of system 10 (that is, does not suppress wafer damage to the same extent as system 10).

FIG. 3 depicts a system 130 which is the converse or reverse of system 120 in that the top electrode 25P is connected to the chamber wall and the enclosure is connected to the low frequency power.

FIG. 4 depicts a system 140 which does not use a top electrode. Instead, both the low frequency and the high frequency sources are connected to the wafer support electrode 32. The differences occasioned by this mixed frequency arrangement relative to system 10, FIG. 1 are, first, HF and LF power are used to control density and energy, respectively, using a single electrode, and, second, this arrangement does not provide the damage suppression characteristics of system 10 (that is, does not suppress damage to the extent of system 10).

The matching network 28 described above is preferred for satisfying the requirements imposed by the high frequency, differential drive, ungrounded, balanced split electrode arrangement. Also, the transmission line structure 32 and associated matching network 43 are preferred approaches. More generally, conventional transmission line structures and match networks can be used, in particular for the low frequency connections.

7. Apparatus Examples

A present working embodiment of my system incorporates the domed configuration and the split electrode configuration depicted in FIG. 1. The short quartz bell jar chamber 17 has a diameter of 10 inches. The 10.2-inch diameter, two-inch height electrode 25 is ungrounded and surrounds the domed processing chamber 16A. Reflector box 44 is of aluminum. Operation using high frequency RF energy of 1 kilowatt, 200 MHz provides a plasma which extends about 4 inches downstream (i.e., below) the top electrode to the wafer. This provides a plasma density of $1-2\times10^{12}/cm^3$ and ion saturation current density of 10–15 mA/cm$^2$ downstream at the wafer. A low frequency auxiliary bias of 13.56 MHz, 200 watts applied to a 5-inch wafer positioned on the support electrode approximately 4 inches below (downstream) of the top electrode provides a 200 volt cathode sheath voltage.

8. Process Examples

The above-described reactor embodying my present invention is uniquely useful for numerous plasma processes such as reactive ion etching (RIE), high pressure plasma etching, low pressure chemical vapor deposition (CVD) including sputter facet deposition and planarization, and high pressure conformal isotropic CVD. Other applications include, but are not limited to, sputter etching, ion beam etching, or as an electron, ion or active neutral plasma source.

RIE and low pressure CVD typically use pressures of up to 500 mt (millitorr). High pressure plasma etch and high pressure conformal isotropic CVD processes may be carried out at pressures from about 500 mt to about 50 torr.

(a) Reactive Ion Etching (RIE)

In accordance with my invention, silicon oxide, silicon (single crystal silicon), polysilicon (polycrystalline silicon), aluminum and other materials can be etched in an RIE mode. For this purpose, the high frequency em (electromagnetic) energy is coupled to the plasma by the top electrode 25. Typically, relatively lower frequency AC energy is applied to the cathode 32 (the wafer support electrode or cathode). The high frequency top electrode power is selected to obtain the desired plasma and ion flux density, and the lower frequency AC bias power is selected to independently control the desired cathode sheath voltage and, thus, the ion energy. Please note, in low pressure applications, that is, those involving pressures within the approximate range 0.1–500 millitorr, the cathode or wafer sheath voltage closely approximates the DC bias of the cathode and, as a consequence, bias voltage measurements may be used to monitor the cathode or wafer sheath voltage values.

Typically, the useful high frequency em energy range is 50–800 MHz, the preferred useful range 50–400 MHz and the most preferred range 50–250 MHz. Relatively low frequency AC energy (bias energy) ranges are 10 (KHz–50 MHz, 100 KHz –30 MHz and 5–15 MHz. Unless otherwise specified, the frequency and pressure ranges specified previously in this numbered section apply to the process parameters specified in the RIE tables below. The useful, preferred and most preferred ranges correspond generally to the ranges 1, 2 and 3 in the tables.

RIE Example 1: Silicon Oxide over Polysilicon
(Contact Window Hole Etch)

As a first example of the RIE of silicon oxide, consider forming contact window holes through oxide to underlying polysilicon gates. This application is occasioned by a multiplicity of requirements, including no damage to the polysilicon gates or to the underlying gate oxide; no microloading; high oxide/poly selectivity (20/1); vertical oxide etch profile; and high oxide etch rate (typical oxide thicknesses are $\geq 1$ micron). The high selectivity requires approximately 500 eV ion energy in the etching plasma.

As is known to those of usual skill in the art, suitable gas chemistries for etching contact window holes in oxide comprise fluorine as the main etchant for providing a high etch rate, and may include carbon- and hydrogen-containing gases for enhancing etch selectivity. Specific gases used include $CHF_3$, $CF_4$, $C_2F_6$, $C_4F_8$, $CH_4$, $H_2$, $NF_3$, and $SF_6$. Preferred carbon to fluorine ratios are C/F=0.1/1–2/1 and, when hydrogen is present, the preferred hydrogen to fluorine ratios are H/F=0.1/1–0.5/1. Argon is a preferred inert gas dopant, because it is relatively massive and inert and, thus, contributes to the sputter etch components of the RIE process, improving the vertical anisotropy.

Using 1 kW, 200 MHz high frequency power ("top" power); 600 watts, 13.56 MHz auxiliary bias ("bottom" or "bias" power); 10–30 millitorr pressure; the gas chemistry $CHF_3$/argon and gas flow rates 100 sccm/120 sccm provides oxide etch rates of 5,000–7,000 Angstroms/minute with an oxide-to-poly selectivity of 20/1.

Table 1 summarizes typical contact window etch processes which satisfy the above-described rigid etch requirements.

RIE Example 2: Silicon Oxide over Metal (Via Hole Etch)

As a second example of RIE etching of silicon oxide, consider via hole etching through a silicon oxide layer to an underlying aluminum conductor layer or other metal layer. Here, the critical multiple requirements include no damage to the underlying devices; no damage (i.e., no sputtering) of the underlying aluminum; a vertical oxide etch profile; and a high oxide etch rate. A suitable gas chemistry for these purposes includes fluorine compounds and, typically, carbon. Hydrogen may be used to improve oxide/photoresist etch selectivity. Specific gases used include $CHF_3$, $CF_4$, $C_2F_6$, $C_4F_8$, $CH_4$, $H_2$, $NF_3$, and $SF_6$. Preferred ratios are C/F=0.1/1–2/1 and, when H is present, H/F=0.1/1–0.5/1. As in the previous oxide example, argon is the preferred inert gas additive, because it is relatively massive and thus contributes to the sputter etch (of the oxide) component of the RIE process, improving the vertical anisotropy of the process. Also, a low cathode sheath voltage, typically $\leq 300$ volts, is desirable to avoid sputtering the aluminum. Preferably, the voltage is $\leq 200$ volts and most preferably about 100–150 volts.

Using top power of 1.5 kVW and 200 MHz; pressure of 10–30 millitorr; reduced bias or bottom power of about 200 watts at 13.56 MHz to provide a 200 volt cathode sheath voltage; and $CHF_3$/$CF_4$/argon gas chemistry at flow rates of 75/75/120 sccm etches vertical-wall via holes at a rate of 4,000–5,000 Angstroms/minute without sputtering of the aluminum. Other chemistries may be used as known by those skilled in the art, such as $CF_4$, $C_2F_6$, $C_4F_6$, $CH_3F$, $CH_4$ which may be used in various combinations.

Table 2 discloses silicon oxide etch processes which are well suited to etching via holes. The representative cathode bias voltages disclosed in Table 2 provide the desired cathode sheath voltages.

RIE Example 3: Oxide Sputter Etch

Table 3 specifies typical processing parameters for effecting a third type of non-reactive ion etch oxide etch process, oxide sputter. This process is useful for the etchback of deposited films and removal of native oxide on silicon using a relatively non-reactive gas, preferably argon.

RIE Example 4: Selective Polysilicon Etch (Etch Poly Gate Selectively to Oxide)

RIE etching of polysilicon and in particular selective etching of polysilicon with respect to oxides such as underlying oxide layers, requires an etch process characterized by no damage (to interconnects, gates and gate oxides); no microloading; vertical polysilicon etch profile; a high poly/oxide etch selectivity (typically $\geq 30/1$); and a moderate etch rate (poly thicknesses are 2,000–5,000 Angstroms). Referring to Table 4, suitable gas chemistries for achieving these goals include halogen-containing gases compounds. At conventional etch temperatures, >about 0° C., chlorine or bromine chemistry is preferred. Below about −40° C., fluorine chemistry can be used. Optionally, an inert gas(es) such as argon or helium may be added to the gas chemistry to enhance the vertical etch anisotropy. Other dopant gases such as oxygen may be added to improve the poly/oxide etch selectivity. As is true of the above-described RIE etching of oxide over aluminum, a low cathode sheath voltage (<200 volts; <100 volts; 50–100 volts); is preferred to obtain high poly silicon/oxide etch selectivity.

The following process parameters provide a polysilicon gate-forming etch rate of 3,000–4,000 Angstroms/minute with a 35/1 selectivity of polysilicon/oxide: 500 watts at 200 MHz top power operated at resonance; bottom power of 100 watts at 13.56 MHZ, providing a low cathode sheath voltage of approximately 75 volts; pressure 10–50 millitorr; and etching gas chemistry $Cl_2$/He/$O_2$ (oxygen optional) at flow rates of 80 sccm/400 sccm/(0–4 sccm). Other chlorine sources such as $BCl_3$ may be used.

RIE Example 5: Aluminum Etch

Table 5 depicts the process parameters for RIE etching of aluminum which satisfy the requirements that there be no damage to underlying devices and no corrosion of aluminum and that the process provide a high aluminum etch rate (typically 5,000–10,000 Angstroms/min.). Suitable gas chemistries include chlorine- and bromine-containing gases, alone or in combination. Relatively non-reactive/inert gases such as argon may be added for the purpose of profile control. To minimize corrosion of aluminum after etch by chlorinated species, a photoresist strip and Al fluorine passivation can be performed in the same or another chamber.

RIE Example 6: Single Crystal Silicon Etch

Table 6 depicts the representative proven parameters for RIE etching of single crystal silicon in accordance with the process requirements that there be no damage (lattice damage results from high energy bombardment in conventional RF systems) and that the process provide a vertical silicon etch profile, i.e., a high aspect ratio (l/w). The gas chemistry includes halogen species and preferably both bromine and fluorine species (e.g., HBr+$SiF_4$ or HBr+$SiF_4$+$NF_3$) for profile control as well as dopants such as helium and oxygen, also for profile control (HBr/$SiF_4$/$NF_3$/$O_2$/He).

RIE Example 7: Tungsten Etch

Table 7 discloses the process parameters for RIE etching tungsten without damage to underlying devices. The process is based upon a gas chemistry which comprises a fluorine-containing gas such as $NF_3$ or $SF_6$ and, optionally, inert gas such as argon for the purpose of increasing the sputter etch component.

RIE Example 8: Anisotropic Photoresist Etch

Anisotropic RIE etching of photoresist may be used, for example, for patterning resist for advanced devices. Process requirements are vertical etch profile and no damage to underlying devices. Table 8 discloses the parameters for anisotropic patterning of photoresist using RIE. The associated gas chemistry comprises oxygen and, optionally, fluorine-containing gas such as $CF_4$, $C_2F_6$, $NF_3$ and/or $SF_6$. The wafer is maintained at a low temperature, preferably <125° C., and most preferably <75° C., to avoid photoresist reticulation. As discussed previously in the apparatus disclosure, fluid cooling of the wafer support electrode/cathode/pedestal can be used to provide the necessary temperature control.

Anisotropic profiles are etched in photoresist using top power of 1 kW at 200 MHz; pressure of 10–30 millitorr; gas chemistry and associated flow rates of 30–100 sccm $O_2$ and 10–50 sccm $CF_4$ (optional); a bottom bias of 0–200 watts at 13.56 MHz; and a cathode temperature of about 60 degrees C. The process provides an anisotropic photoresist etch rate of 0.8–3 micrometers/minute.

RIE Example 9: Barrier Layer Etching

Barrier layers of material such as titanium, tungsten or titanium nitride are thin layers formed between layers of material such as oxide and aluminum. For example, barrier layers can be used to prevent damage/etching of aluminum during the formation of via holes in overlying oxide layers. The barrier layer must be removed after the oxide via etch and prior to filling the via to permit proper ohmic contact to the aluminum. The critical features of such a barrier layer etch process include no damage to underlying layers or devices, for example, by sputtering the underlying aluminum. Table 9 discloses the process parameters for a halogen-based gas chemistry comprising chlorine-containing and fluorine-containing constituents.

b) Light Etch

A so-called light oxide etching is used after a main oxide etch step, to remove damaged thin layers of material such as oxide or polysilicon, without incurring additional damage. My light etch satisfies the requirements of removing damaged removal without additional damage in part by providing downstream etching (at the wafer support electrode/cathode) using low bombardment energies. Table 10 shows a suitable light oxide etch process which uses fluorine-containing gas chemistry. The light oxide etch process of Table 10 can be changed to a light etch process for polysilicon by substituting a chlorine-containing constituent gas such as $Cl_2$ for the fluorine-containing gas.

In one specific example, top power of 200–1,000 watts at 200 MHz; no bias or bottom power; 10–50 millitorr pressure; and 30–120 sccm $CF_4$ provides a low energy oxide etch rate of 100–1,000 Angstroms/minute.

c) High Pressure Plasma Etch

In accordance with my invention, silicon oxide, polysilicon, photoresist and other materials can be etched in a high pressure plasma etch mode. Certain basic features and operation are as described above in the first paragraph under the section 11 heading. Specifically, the high frequency em energy is coupled to the plasma by the substantially closed loop top electrode. Relatively lower frequency AC energy may be applied to the cathode (the wafer support electrode/cathode) as required. The high frequency top power is selected to obtain the desired ion flux density and the lower frequency AC bias power is selected to independently obtain and control the desired cathode sheath voltage and, thus, ion energy.

Profile control is possible during the high pressure etch by selecting the bias power and pressure as follows. At high pressure (1–50 torr) and low bias power (0–200 W), the process may be isotropic or semi-anisotropic horizontally. By increasing the bias power (200 W–1,000 W) and/or decreasing the pressure (500 mt–1 torr), the etch process may be semi-anisotropic vertically or anisotropic vertically. In general, increasing/decreasing bias power increases/decreases vertical anisotropy, while decreasing/increasing the pressure increases/decreases vertical anisotropy. Typically, useful top and bias frequencies are, respectively, 50–800 MHz and 10 KHz–50 MHz, while more preferred useful ranges are 50–400 MHz and 100 KHz–30 MHz, and presently the most preferred ranges are 50–250 MHz and 5–15 MHz.

High Pressure Plasma Etch: Isotropic Oxide Etch

Figure 6:
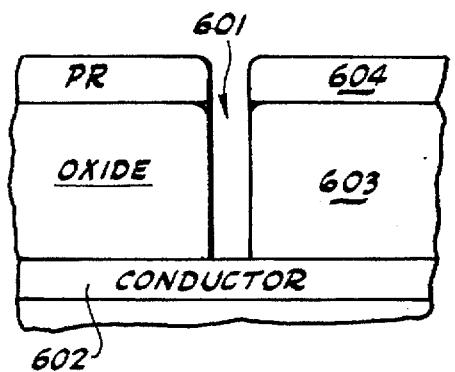
FIG. 6 depicts a representative integrated circuit via hole.
Figure 7:
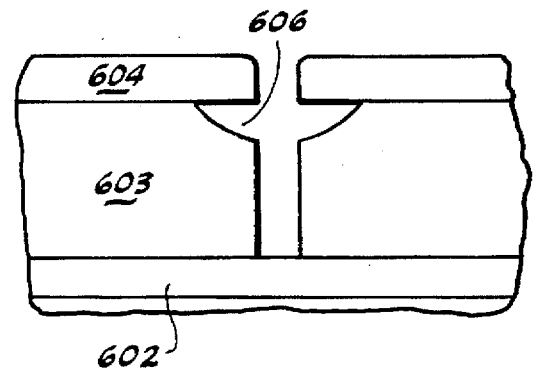
FIG. 7 depicts the via hole of FIG. 6 after application of a widening sequence in accordance with my invention.

FIG. 6 depicts the structure which exists after contact or via holes 601 are etched through an oxide layer 603 to underlying conductor 602 using the photoresist pattern definition mask 604. As integrated circuit devices become increasingly small and features such as the via holes 601 become correspondingly narrower, filling the hole becomes increasingly difficult. Referring to FIG. 7, the aluminum fill is made easier by first widening the top of the hole, as indicated at 606, FIG. 7. The widening step requires an etch process that has a horizontal etch component. In addition, it is desirable that this etch step not damage the integrated circuit components. My process described in Table 11 satisfies these requirements and, thus, is ideally suited to the application depicted in FIG. 7 as well as to other applications requiring directional control.

Furthermore, as alluded to above, bias power and pressure may be selected to vary the etch directionality from preferentially horizontal using relatively high pressure (3–50 torr) with no bias or very low bias, to isotropic at moderate pressure (1–3 torr) and no to low bias (0–200 W), to preferentially vertical at lower pressure (500 mt–1 torr) and higher bias (200–1,000 W). As indicated in Table 11 wafer temperatures are maintained below 125° C. for the purpose of preventing photoresist reticulation and the resultant loss of pattern definition.

Using top power of 1–1.5 kW at 200 MHz; pressure of about 1 torr; 500 sccm–2,000 sccm $NF_3$ or $CF_4$; and a cathode temperature of about 60–75 degrees C. provides an isotropic silicon oxide etch rate of about 2,500–4,500 Angstroms/minute.

Photoresist Strip

Stripping thick photoresist masks requires high photoresist etch rates without damage to associated integrated circuit components and without etch residue. A downstream process is preferred. Table 12 depicts a suitable process which is based upon a gas chemistry comprising oxygen as the main photoresist etchant and, optionally, including nitrogen for the purpose of increasing strip rate and/or preferably fluorine-containing gas for passivation (of aluminum). The wafer temperature is controlled to below 300° C. for the purpose of avoiding resist reticulation. In addition, the third example (range 3) in the table effects fluorine passivation.

A fast downstream photoresist strip process uses top power of 1–1.5 kW at 200 MHz; (no bias or bottom power); pressure of about 1 torr; etching gas chemistry and flow rates of 800–1,000 sccm $O_2$, 100–200 sccm $N_2$ (optional) and 0–100 sccm $CF_4$ (optional); and a cathode temperature of 100–200 degrees C. (the strip rate is temperature dependent) and provides a strip rate of 1–3 micrometers per minute.

14. Chemical Vapor Deposition (CVD)

In accordance with my invention, low pessure chemical vapor deposition (LPCVD) may be used to deposit various materials including silicon oxide, boron- and phosphorous-doped oxide (including borosilicate glass (BSG), phosphosilicate glass (PSG) and borophosphosilicate glass (BPSG)) and plasma nitride. The top electrode, bias electrode and pressure ranges for effecting CVD (chemical vapor deposition) are similar to those used for the above-described RIE etching processes. That is, the high frequency em energy coupled to the plasma has a useful frequency range 50–800 MHz, preferred useful range 50–400 MHz, and presently preferred range 50–250 MHz. The relatively lower frequency AC energy is applied when required to the wafer support electrode/cathode using ranges of 10 KHz–50 MHz, 100 KHz–30 MHz and 5–15 MHz. The high frequency top power is selected to obtain the desired ion flux density and the lower frequency AC bias power is selected to independently obtain and control the desired cathode sheath voltage and, thus, ion energy. Preferably, pressure is in the range 0.1–500 mt and, more preferably, 1–100 mt.

Also in accordance with my invention, high pressure chemical vapor deposition (HPCVD) may be used to deposit various materials including those discussed in the previous paragraph using the high frequency top energy and the low frequency bias energy described in the preceding paragraph, but typically using pressure >500 millitorr.

In the HPCVD application, the high frequency em energy is coupled to the plasma by the top electrode and the relatively lower frequency AC energy is applied to the wafer support electrode. As mentioned, the high frequency power is selected to obtain the desired plasma density and the lower frequency AC bias power is selected to independently obtain and control the desired cathode sheath voltage and thus ion energy. For HPCVD processes, both radical and ion flux densities are important. The high pressure is used to vary the ratio of the radical deposition component to the ion deposition component. Relatively higher pressure (5–50 mt) and lower bias (0–200 mt) generate more radicals with respect to ions and lower bias yields less ion directionality. Relatively lower pressures of about 500 mt–5 torr and higher biases generate less radicals with respect to ions, and higher bias of about 200–1,000 W yields more ion directionality. By controlling these parameters, the degree of deposited film conformality can be varied, from slightly preferentially horizontal under conditions of high pressure, no bias; to isotropic using very low bias to no bias, moderate pressure; to preferentially vertically at lower pressure, higher bias. Preferentially horizontal pressure 10–50 torr, no bias; isotropic pressure 5–10 torr, bias 0–200 W; and preferentially vertical pressure 500 mt–5 torr, bias 200–1,000 W.

(a) Low Pressure CVD

1) Plasma Nitrides and Plasma Oxynitrides

Applications of plasma nitride and plasma oxynitride include as passivation layers and intermetal dielectrics. In such applications, the associated deposition process must not damage devices. When used to form passivation layers, the process must provide good moisture barrier with stress control and when used to deposit an intermetal dielectric, it must provide step coverage, high dielectric strength, controlled physical properties (stress), electrical properties (dielectric strength and dielectric constant), optical properties (absorption spectrum) and chemical properties (hydrogen content). Please note, typically plasma nitride and plasma oxynitride are not stoichiometric; rather, the deposited nitride materials are Si-H-N and the oxynitride materials are Si-H-O-N.

Typically, the gas chemistry comprises silane and nitrogen when low hydrogen content nitride is required, or silane, nitrogen and ammonia where higher hydrogen content can be tolerated, or the same considerations apply to oxynitride except that the gas chemistry includes an oxygen-containing gas such as nitrous oxide or oxygen itself, and typically a lower nitrogen flow rate. The corresponding processes for plasma nitride deposition and for plasma oxynitride deposition are summarized below, respectively, in Tables 13 and 14.

2) LPCVD Oxide

Applications for LPCVD silicon oxide include intermetal dielectrics. Critical process requirements include no damage to underlying devices, gap-filling capability, high rate deposition and control of physical, electrical, optical and chemical properties, as described in greater detail above with respect to LPCVD plasma nitride. Typically, the gas chemistry for the process includes a silicon-containing gas (such as silane or TEOS), an oxygen-containing gas (oxygen itself or nitrous oxide) and, optionally, an inert gas (typically, argon). Additional boron and phosphorous dopants may be used to provide BSG, PSG and BPSG glasses, and arsenic dopant may be added for the purpose of, for example, improving step coverage. The relevant process is summarized in Table 15.

One variation on the above LPCVD oxide process is bias sputter deposition, which is a two-step process. First, the process of Table 15 is used, but with no bottom bias, to deposit a thin oxide layer while ensuring that the aluminum is not sputtered. Second, bottom bias and argon flow are added as indicated in Table 15 to effect sputter facet deposition.

In a third variation, silicon oxide planarization may be effected by modifying the bias sputter deposition process so that the ratio of unbiased deposition rate to sputter etch rate is selected to planarize the wafer topography. The sputter etch rate is determined by the bias and pressure while the unbiased deposition rate is determined by the top power and the reactant species. Consequently, the ratio is determined by selecting the four factors, bias power, pressure, top power and reactant flow rates.

In a fourth variation, the silicon oxide planarization can be extended to provide a global or large area planarization process by incorporating materials such as $B_2O_3$ which readily flows during the deposition process and fill large areas between features. For the exemplary $B_2O_3$, the associated gas chemistry is TMB (trimethylborate) and $O_2$ (optional inert gas (He)).

3) CVD Low Pressure (Facet) Deposition

In this process, sometimes known as a CVD facet process, etching of the materials (e.g., oxide or nitride) deposited on the outside (upper) corners of a trench in the silicon wafer is also carried out simultaneously with the deposition of oxide or nitride into the trench to avoid formation of voids in the filler material. In the prior art, such faceting and deposition was carried out simultaneously in ECR/microwave frequency plasma CVD. The prior art use of plasma-assisted CVD at high frequencies, such as 13.56 MHz, resulted in the need for cycling the wafer between a deposition chamber and an etching chamber to achieve the desired faceting.

In accordance with my invention, simultaneous low pressure CVD deposition and faceting may be carried out using a plasma-assisted CVD process wherein the plasma is energized by the top electrode operating in a frequency range of about 50 MHz to 800 MHz and, preferably, in a frequency range of from about 50 MHz up to about 250 MHz. Wafer bias is applied to effect sputter faceting. The use of complicated microwave/ECR equipment, and the need for cycling the wafer between deposition and etching chambers, are avoided.

Additionally, planarization of the wafer topography may be performed by selecting the ratio of unbiased deposition rate to sputter etch rate based on device/feature geometry. It may be combined with deposition of such materials as $B_2O_3$ which flow during the deposition process to globally planarize the wafer.

(b) High Pressure CVD

1) Conformal Isotropic Plasma Nitride And Plasma Oxynitride

Like their LPCVD counterparts, my high pressure CVD, conformal, isotropic plasma nitride and oxynitride processes have application such as to passivation layers and intermetal dielectrics. The requirements and gas chemistries discussed above relative to their LPCVD counterparts apply here as well. In the HPCVD process, bias power is used to control film density and stress. The processes for depositing low hydrogen nitride ($SiH_4+N_2$) and conventional higher hydrogen plasma nitride (silane+nitride+ammonia) are summarized in Table P.

Table 16 can be used for the deposition of low hydrogen content oxynitride and higher hydrogen content oxynitride by incorporating an oxygen source (oxygen or, preferably, nitrous oxygen) in the gas chemistry. The same $N_2$ flow rates are used for oxynitride and nitride.

2) Conformal Isotropic Silicon Oxide

The applications and associated requirements for this HPCVD process are similar to those for the LPCVD counterpart, with the possible exception that the LPCVD process is more suitable to filling gaps the HPCVD process may be favored for step coverage applications. My present HPCVD process uses a gas chemistry comprising silicon-containing species (typically, silane or TEOS (tetraethylorthosilicate or tetraethyloxysilicate)), an oxygen-containing species (typically, oxygen itself or preferably nitrous oxide) and, optionally, an inert gas (typically, argon). The overall HPCVD process for depositing conformal silicon oxide is summarized in Table 17.

The above examples are representative. Those of usual skill in the art will readily extend the examples to achieve isotropic and anisotropic etching of various materials.

TABLE 1

OXIDE CONTACT WINDOW ETCH
OXIDE/POLY

| | Range | | |
|---|---|---|---|
| Parameter | 1 | 2 | 3 |
| Top elect. power (W) | 300–5000 | 500–2500 | 800–2000 |
| Top freq. (MHz) | 50–800 | 50–400 | 50–250 |
| Bias power (W) | 100–1000 | 200–1000 | 400–800 |
| Bias freq. | 10 KHz–50 MHz | 100 KHz–30 MHz | 5–15 MHz |
| Press. (mt) | ≦500 | 1–100 | 5–50 |
| Wafer temp. (°C.) | ≦125 | — | — |

TABLE 1-continued

OXIDE CONTACT WINDOW ETCH
OXIDE/POLY

| | Range | | |
|---|---|---|---|
| Parameter | 1 | 2 | 3 |
| Gas Chemistry (sccm) | | | |
| Etchant | CF = 0.1/1–2/1 | $CHF_3$ = 30–600 | 50–300 |
| Dopant | HF = 0.1/1–0.5/1 | Ar = 30–600 | 50–300 |

TABLE 2

OXIDE VIA HOLE ETCH
OXIDE/ALUMINUM

| | Range | | |
|---|---|---|---|
| Parameter | 1 | 2 | 3 |
| Top elect. power (W) | 100–5000 | 300–2500 | 800–2000 |
| Top freq. (MHz) | 50–800 | 50–400 | 50–250 |
| Bias power (W) | 100–1000 | 100–500 | 100–300 |
| Bias freq. | 10 KHz–50 MHz | 100 KHz–30 MHz | 5–15 MHz |
| Cathode Sheath (V) | ≦300 | ≦200 | 5–50 |
| Press. (mt) | ≦500 | 1–100 | 5–50 |
| Wafer temp. (°C.) | ≦125 | — | — |
| Gas Chemistry (sccm) | | | |
| Etch | CF = 0.1/1–2/1 | $CHF_3$ | 50–300 |
| | HF = 0.1/1–0.5/1 | $CF_4$ | 50–300 |
| | | Ar | 50–300 |

TABLE 3

OXIDE SPUTTER ETCH

| | Range | | |
|---|---|---|---|
| Parameter | 1 | 2 | 3 |
| Top elect. power (W) | 300–5000 | 500–2500 | 800–2000 |
| Top freq. (MHz) | 50–800 | 50–400 | 50–250 |
| Bias power (W) | 0–1000 | 100–800 | 100–300 |
| Bias freq. | 10 KHz–50 MHz | 100 KHz–30 MHz | 5–15 MHz |
| Press. (mt) | ≦500 | 1–100 | 1–30 |
| Wafer temp. (°C.) | — | — | — |
| Gas Chemistry (sccm) | | | |
| Etchant | Non-reactive | Ar | Ar |

TABLE 4

POLY/OXIDE

| Parameter | | Range 1 | 2 | 3 | |
|---|---|---|---|---|---|
| Top elect. power (W) | | 200–1500 | 300–1000 | 300–750 | |
| Top freq. (MHz) | | 50–800 | 50–400 | 50–250 | |
| Bias power (W) | | 0–500 | 0–300 | 0–200 | |
| Bias freq. | | 10 KHz–50 MHz | 100 KHz–30 MHz | 5–15 MHz | |
| Cathode Sheath (V) | | ≦200 | ≦100 | 50–100 | |
| Press. (mt) | | ≦500 | 1–100 | 5–50 | |
| Wafer temp. (°C.) | (1) | >–40° C. | | | |
|  | (2) | <–40° C. | | | |
| Gas Chemistry (sccm) | | | | | |
| Etch | (1) | Cl or Br | Cl$_2$ or HBr or BCL$_3$ + Ar | Cl$_2$ He O$_2$ | 50–300 50–300 0–20 |
|  | (2) | F | SF$_6$ or NF$_3$ + Argon | SF$_6$ Ar | 30–300 30–300 |

TABLE 5

RIE ALUMINUM

| Parameter | Range 1 | 2 | 3 |
|---|---|---|---|
| Top elect. power (W) | 500–1500 | 600–800 | 600–800 |
| Top freq. (MHz) | 50–800 | 50–400 | 50–250 |
| Bias power (W) | 100–400 | 100–200 | 100–200 |
| Bias freq. | 10 KHz–50 MHz | 100 KHz–30 MHz | 5–15 MHz |
| Press. (mt) | ≦500 | 1–100 | 5–50 |
| Wafer temp. (°C.) | ≦125 | — | |
| Gas Chemistry (sccm) | | | |
| Etch | Cl$_2$/BCl$_3$ | Cl$_2$ + BCl$_3$ | Cl$_2$ = 30–100 BCl$_3$ = 30–100 |
| Dopant | BBr$_3$ | | |

TABLE 6

RIE SILICON

| Parameter | Range 1 | 2 | 3 |
|---|---|---|---|
| Top elect. power (W) | 100–2500 | 300–700 | 300–700 |
| Top freq. (MHz) | 50–800 | 50–400 | 50–250 |
| Bias power (W) | 0–500 | 50–200 | 50–150 |
| Bias freq. | 10 KHz–50 MHz | 100 KHz–30 MHz | 5–15 MHz |
| Press. (mt) | ≦500 | 5–50 | 5–50 |
| Wafer temp. (°C.) | ≦125 | ≦100 | ≦75 |

TABLE 6-continued

RIE SILICON

| Parameter | Range 1 | 2 | 3 | |
|---|---|---|---|---|
| Gas Chemistry (sccm) | | | | |
| Etchant | Halogen | HBr/SiF$_4$/NF$_3$ | HBr SiF$_4$ HBr | 30–100 0–20 0–10 |
| Dopant | | He/O$_2$ | O$_2$ NF$_3$ | 0–10 0–20 |

TABLE 7

RIE TUNGSTEN

| Parameter | Range 1 | 2 | |
|---|---|---|---|
| Top elect. power (W) | 100–2500 | 200–500 | |
| Top freq. (MHz) | 50–800 | 50–250 | |
| Bias power (W) | 0–500 | 0–200 | |
| Bias freq. | 10 KHz–50 MHz | 5 MHz–15 MHz | |
| Press. (mt) | ≦500 | 10–100 | |
| Wafer temp. (°C.) | — | — | |
| Gas Chemistry (sccm) | | | |
| Etchant | F | NF$_3$ SF$_6$ | 0–200 0–200 |
| Dopant | Inert | Ar | 0–200 |

TABLE 8

ANISOTROPIC RIE PHOTORESIST

| Parameter | Range 1 | 2 | 3 |
|---|---|---|---|
| Top elect. power (W) | 300–2500 | 300–1500 | 300–1500 |
| Top freq. (MHz) | 50–800 | 50–400 | 50–250 |
| Bias power (W) | 0–500 | 0–300 | 0–200 |
| Bias freq. | 10 KHz–50 MHz | 100 KHz–30 MHz | 5–15 MHz |
| Press. (mt) | ≦500 | 1–100 | 5–50 |
| Wafer temp. (°C.) | | ≦125 | ≦75 |
| Gas Chemistry (sccm) | | | |
| Etchant | O | O$_2$ | 10–300 |
| Dopant | F | CF$_4$ | 0–300 |

TABLE 9

RIE BARRIER LAYER TiW/TiN

| Parameter | Range 1 | 2 | 3 | | |
|---|---|---|---|---|---|
| Top elect. power (W) | 100–2500 | 300–1000 | 300–600 | | |
| Top freq. (MHz) | 50–800 | 50–400 | 50–250 | | |
| Bias power (W) | 0–500 | 0–200 | 100–200 | | |
| Bias freq. | 10 KHz–50 MHz | 100 KHz–30 MHz | 5–15 MHz | | |
| Press. (mt) | ≦500 | 1–100 | 5–50 | | |
| Wafer temp. (°C.) | | | | | |
| Gas Chemistry (sccm) | | | | | |
| Etch | Halogen | F + Cl | $CF_4$ | 0–20 | |
| | | | $BCl_3$ | 10–100 | |
| | | | $Cl_2$ | 0–20 | |

TABLE 10

LIGHT ETCH

| Parameter | Range 1 | 2 | | |
|---|---|---|---|---|
| Top elect. power (W) | 100–1000 | 100–1000 | | |
| Top freq. (MHz) | 50–800 | 50–250 | | |
| Bias power (W) | 0–200 | 0–200 | | |
| Bias freq. | 10 KHz–50 MHz | 5–15 MHz | | |
| Press. (mt) | ≦500 | 5–100 | | |
| Wafer temp. (°C.) | — | — | | |
| Gas Chemistry (sccm) | | | | |
| Oxide | F | $CF_4$ or $NF_3$ | 30–120 | 30–120 |
| Poly | Cl | $Cl_2$ | 30–120 | |

TABLE 11

HP ISOTROPIC OXIDE ETCH

| Parameter | Range 1 | 2 | 3 |
|---|---|---|---|
| Top elect. power (W) | 500–5000 | 500–2500 | 500–2500 |
| Top freq. (MHz) | 50–800 | 50–400 | 50–250 |
| Bias power (W) | 0–500 | 0–300 | 0–300 |
| Bias freq. | 10 KHz–50 MHz | 100 KHz–30 MHz | 5–15 MHz |
| Press. (mt) | ≦500 mt | 0.5–20 torr | 0.5–5 torr |
| Wafer temp. (°C.) | ≦125 | ≦100 | 60–75 |

TABLE 11-continued

HP ISOTROPIC OXIDE ETCH

| Parameter | Range 1 | 2 | 3 | |
|---|---|---|---|---|
| Gas Chemistry (sccm) | | | | |
| Etch | F | $CF_4$ | $CF_4$ or $NF_3$ | 500–200 |
| | | $NF_3$ | | 500–200 |
| | | $SF_6$ | | |
| | | $C_2F_6$ | | |

TABLE 12

PHOTORESIST STRIP

| Parameter | Range 1 | 2 | 3 | |
|---|---|---|---|---|
| Top elect. power (W) | 300–5000 | 300–2500 | 300–2500 | |
| Top freq. (MHz) | 50–800 | 50–400 | 50–250 | |
| Bias power (W) | 0–1000 | 0–1000 | 0–1000 | |
| Bias freq. | 10 KHz–50 MHz | 100 KHz–30 MHz | 5–15 MHz | |
| Press. (mt) | 100 mt–50 torr | 500 mt–10 torr | 500 mt–5 torr | |
| Wafer temp. (°C.) | ≦300 | ≦250 | 100–200 | |
| Gas Chemistry (sccm) | | | | |
| Etchant | O | $O_2, N_2O$ | $O, N_2O$ | 500–2000 |
| Dopant | F, N | $CF_4, NF_3,$ | $N_2$ | 0–5000 |
| | | $SF_6, C_2F_6$ | $CF_4$ | 0–500 |
| | | | $NF_3$ | 0–500 |

TABLE 13

LP PLASMA NITRIDE DEPOSITION

| Parameter | 1 | 2 | 3 |
|---|---|---|---|
| Top elect. power (W) | 300–5000 | 300–2500 | 300–2500 |
| Top freq. (MHz) | 50–800 | 50–400 | 50–250 |
| Bias power (W) | 0–1000 | 0–600 | 0–600 |
| Bias freq. | 10 KHz–50 MHz | 100 KHz–30 MHz | 5–15 MHz |
| Press. (mt) | ≦500 | ≦50 | ≦50 |
| Wafer temp. (°C.) | — | 100–500 | 200–400 |
| Gas Chemistry (sccm) | Si & N | $SiH_4$ | 30–300 |
| | | $N_2$ | 100–1000 |
| | | $NH_3$ | 0–50 |

TABLE 14

LP PLASMA OXYNITRIDE DEPOSITION

| Parameter | 1 | 2 | 3 |
|---|---|---|---|
| Top elect. power (W) | 300–5000 | 300–2500 | 500–2500 |
| Top freq. (MHz) | 50–800 | 50–400 | 50–250 |
| Bias power (W) | 0–1000 | 0–600 | 0–600 |
| Bias freq. | 10 KHz–50 MHz | 100 KHz–30 MHz | 5–15 MHz |
| Press. (mt) | ≦500 | ≦50 | ≦50 |
| Wafer temp. (°C.) | — | 100–500 | 200–400 |
| Gas Chemistry (sccm) | Si | $SiH_4$ | 30–300 |
| | N | $N_2$ | 100–1000 |
| | O | $O_2/N_2O$ | 100–1000 |
| Dopant | | $NH_3$ | 0–50 |

TABLE 15

LP OXIDE DEPOSITION

| Parameter | 1 | 2 | 3 | |
|---|---|---|---|---|
| Top elect. power (W) | 300–5000 | 500–2500 | 1000–2000 | |
| Top freq. (MHz) | 50–800 | 50–400 | 50–250 | |
| Bias power (W) | 0–1000 | 200–1000 | 200–1000 | |
| Bias freq. | 10 KHz–50 MHz | 100 KHz–30 MHz | 5–15 MHz | |
| Press. (mt) | ≦500 | 1–100 | 1–30 | |
| Wafer temp. (°C.) | ≦500 | 200–400 | 300–400 | |
| Gas Chemistry (sccm) | Si | SiH$_4$/TEOS | SiH$_4$ | 30–100 |
|  | O | O$_2$/N$_2$O | O$_2$ | 30–200 |
| Dopant | Inert | Ar | Ar | 400–800 |

TABLE 16

HP OXIDE/OXYNITRIDE DEPOSITION

| Parameter | 1 | 2 | 3 | |
|---|---|---|---|---|
| Top elect. power (W) | 300–5000 | 300–2500 | 500–1500 | |
| Top freq. (MHz) | 50–800 | 50–400 | 50–250 | |
| Bias power (W) | 0–1000 | 0–300 | 0–300 | |
| Bias freq. | 10 KHz–50 MHz | 100 KHz–30 MHz | 5–15 MHz | |
| Press. (mt) | ≧500 | 500 mt–50 torr | 1–10 torr | |
| Wafer temp. (°C.) | — | 100–500 | 200–400 | |
| Gas Chemistry (sccm) | | | | |
| Nitride | Si | SiH$_4$ | | 30–100 |
|  | N | N$_2$O | | 400–5000 |
|  |  | NH$_3$ | | 0–30 |
| Oxynitride | Si | SiH$_4$ | | 30–100 |
|  | N | N$_2$ | | 400–5000 |
|  | O | N$_2$O | | 400–5000 |
|  | or | O$_2$ | — | |
|  |  | NH$_3$ | | 0–30 |

TABLE 17

HP CONFORMAL OXIDE DEPOSITION

| Parameter | 1 | 2 | 3 | | |
|---|---|---|---|---|---|
| Top elect. power (W) | 300–5000 | 300–2500 | 500–1500 | | |
| Top freq. (MHz) | 50–800 | 50–400 | 50–250 | | |
| Bias power (W) | 0–1000 | 0–1000 | 0–1000 | | |
| Bias freq. | 10 KHz–50 MHz | 100 KHz–30 MHz | 5–15 MHz | | |
| Press. (mt) | >500 | 500 mt–50 torr | 500 mt–10 torr | | |
| Wafer temp. (°C.) | — | 100–500 | 200–400 | | |
| Gas Chemistry (sccm) | Si | SiH$_4$ + N$_2$O | 30–100 + SiH$_4$ | + | 200–3000 N$_2$O |
|  | O | TEOS + O$_2$ | 30–100 + TEOS | + | 100–1000 O$_2$ |
|  |  | TEOS + N$_2$O | 30–100 + TEOS | + | 100–1000 N$_2$O |

Having thus described preferred and alternative embodiments of my system and process those of usual skill in the art will readily adapt, modify and extend the method and apparatus described here in a manner within the scope of the following claims.

I claim:

1. A system for processing a workpiece comprising:
   a vacuum processing chamber for the workpiece;
   a chamber inlet for introducing process gas into the chamber;
   a plurality of electrodes coupling AC electrical energy into the chamber to generate a plasma in the gas, the electrodes comprising a first electrode structure having two separate sections for defining a plasma-generating electrical field, the field being concentrated within a region of the chamber spaced from the workpiece, the field also being principally oriented parallel to the workpiece for preventing ion acceleration from or toward the workpiece, and a second electrode structure adapted to support the workpiece and for modifying a sheath voltage associated with the electrodes and plasma ion energy proximate the workpiece;
   first source of AC electrical energy to the first electrode at a first frequency within the range of about 50 MHz to about 800 MHz, and
   a second source of AC electrical energy to the second electrode at a second frequency within the range of about 0.1 MHz up to but below about 50 MHz, thereby controlling the sheath voltage and the plasma ion energy.

2. The system of claim 1, wherein:
   the chamber includes a dielectric dome internally defining a section of the chamber; the first electrode structure surrounds the chamber section defined within the dome; the second electrode structure has a planar surface proximate and parallel to the workpiece; and
   the first electrode structure and the second electrode structure are positioned for forming an electric field in the chamber parallel to and spaced from the planar surface of the second electrode structure.

3. The system of claim 2, wherein the first electrode structure is located on the interior of the dielectric dome and is covered on the inside of the dielectric dome.

4. The system of 2, wherein the first electrode structure is formed on the exterior of the dielectric dome.

5. The system of claim 1, wherein the first electrode structure comprises a split electrode, the system further comprising means for feeding the gas within the chamber from proximate the chamber inlet to proximate the workpiece for transporting components of the plasma into contact with the workpiece.

6. The system of claim 5,
   wherein the chamber comprises an exhaust port for evacuating the chamber; and
   wherein said chamber inlet comprises:
      said exhaust port which is located opposite the workpiece from the split electrode; and
      a plurality of gas inlet ports for admitting the gas into the chamber, the inlet ports being spaced about the chamber proximate the split electrode for producing gas flow toward the workpiece from the selected region of the chamber.

7. The system of claim 5, wherein the split electrode comprises a pair of approximately semicircular ring members.

8. The system of claim 7, wherein the ring members concentrically enclose the chamber for concentrating the electric field within a right circular cylinder that is perpendicular to the workpiece.

9. The system of claim 1, wherein said chamber comprises a first chamber including said first electrode structure and a second chamber including said second electrode structure and having a central opening in a wall thereof, side walls of said first chamber substantially extending to said central opening, whereby said first chamber substantially uninterruptibly communicates with said second chamber.

10. A system for processing a workpiece in a plasma generated from a gas, comprising:

a vacuum processing chamber for receiving the gas;

a support electrode for supporting the workpiece within the chamber;

a split electrode surrounding a volume of the chamber in parallel spaced relation to the workpiece for capacitively coupling AC electrical energy into the chamber to produce a plasma-inducing electrical field in a selected region of the chamber spaced from the support electrode, to prevent damage to the workpiece, and a first power supply connected to the split electrode for supplying high frequency AC energy having a frequency in the range of 50–800 MHz to the split electrode and for controlling the power of the energy, to provide selected plasma density and plasma ion current density; and a second power supply for applying to the support electrode selected AC electrical energy of lower frequency, in the range 0.1 MHz up to but below 50 MHz, than said capacitively coupled AC electrical energy, and for controlling said selected AC electrical energy applied to the support electrode to control a plasma sheath voltage at the support electrode and an associated plasma ion energy.

11. The system of claim 10, further comprising means for applying to the chamber a magnetic field oriented non-orthogonal to the electric field and transverse to the support electrode, for controlling the location of the plasma and extending the plasma downstream to the workpiece.

12. The system of claim 10, further comprising means for feeding the gas within the chamber from proximate the selected region to proximate the workpiece for transporting components of the plasma into contact with the workpiece.

13. The system of claim 12, wherein the chamber comprises an exhaust port for evacuating the chamber, and wherein the means for feeding the gas comprises:

said exhaust port which is located opposite the workpiece from the split electrode; and a plurality of gas inlet ports for admitting the gas into the chamber, the inlet ports being spaced about the chamber proximate the dielectric dome for producing gas flow toward the workpiece from the selected regions of the chamber.

14. A system for processing a workpiece according to claim 10 wherein said chamber includes a dielectric dome inside the split electrode.

15. A process for generating a plasma, comprising:

supporting a workpiece on a supporting electrode within a vacuum chamber;

supplying gas to the vacuum chamber;

using a surrounding electrode structure having two separate sections surrounding a volume of the vacuum chamber in relation to the workpiece, capacitively coupling electrical energy at a first frequency of from 50–800 MHz into the chamber for generating a plasma from the gas for processing one or more materials on the workpiece; and controlling the power of the first frequency electrical energy;

applying RF energy to the supporting electrode at a second frequency of 0.1 up to but below 50 Mhz; and controlling a power of the RF energy at said second frequency.

16. The process of claim 15, wherein a power delivered to the surrounding electrode structure defines an ion flux density and the power delivered to the supporting electrode defines a cathode sheath voltage, for directing ions and controlling ion energy independently of the ion flux density.

17. The process of claim 15, wherein the plasma is generated within a region of concentration of electrical energy at the first frequency, and wherein the step of supplying the gas to the vacuum chamber comprises the further step of feeding the gas within the chamber in a direction toward the workpiece from proximate the region of first frequency energy concentration.

18. A process for generating a plasma according to claim 15 wherein a first power source is connected to the first frequency electrical energy and is selected to control the plasma density.

19. A process for generating a plasma according to claim 15 wherein a second power source is connected to the second frequency electrical energy and is selected to control the sheath voltage at the supporting electrode.

* * * * *